(12) United States Patent
Hosokawa et al.

(10) Patent No.: US 6,404,029 B1
(45) Date of Patent: Jun. 11, 2002

(54) LIGHT SENSITIVE ELEMENT AND LIGHT SENSITIVE ELEMENT HAVING INTERNAL CIRCUITRY

(75) Inventors: Makoto Hosokawa, Nara; Naoki Fukunaga, Kyoto; Takahiro Takimoto, Nara; Masaru Kubo, Nara; Toshihiko Fukushima, Nara; Isamu Ohkubo, Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/656,461

(22) Filed: Sep. 6, 2000

(30) Foreign Application Priority Data

Sep. 6, 1999  (JP) ............................................. 11-252332

(51) Int. Cl.⁷ .......................... H01L 27/14; H01L 31/00
(52) U.S. Cl. ........................... 257/431; 257/90; 257/461
(58) Field of Search ........................... 257/80, 90, 229, 257/292, 431, 461, 306, 308, 309, 296, 329, 330

(56) References Cited

U.S. PATENT DOCUMENTS

| | | | | |
|---|---|---|---|---|
| 4,831,430 A | * | 5/1989 | Umeji | 257/90 |
| 5,177,581 A | | 1/1993 | Kubo et al. | |
| 5,252,851 A | * | 10/1993 | Mita et al. | 257/461 |
| 5,466,962 A | | 11/1995 | Yamamoto et al. | |
| 5,602,415 A | | 2/1997 | Kubo et al. | |
| 5,859,462 A | * | 1/1999 | Tredwell et al. | 257/229 |
| 6,005,278 A | | 12/1999 | Fukunaga et al. | |
| 6,084,259 A | * | 7/2000 | Kwon et al. | 257/292 |
| 6,269,199 B1 | * | 7/2000 | Maloney | 257/80 |
| 6,252,286 B1 | * | 6/2001 | Arai | 257/431 |

FOREIGN PATENT DOCUMENTS

| | | |
|---|---|---|
| JP | 61-154063 | 7/1986 |
| JP | 11-68146 | 3/1999 |

* cited by examiner

Primary Examiner—David Nelms
Assistant Examiner—Andy Huynh
(74) Attorney, Agent, or Firm—Nixon & Vanderhye

(57) ABSTRACT

A photosensitive device includes a semiconductor substrate and a first semiconductor layer, both of a first conductivity type, with the semiconductor layer being formed on the semiconductor substrate and having a lower impurity concentration than that of the semiconductor substrate. A second semiconductor layer, of a second conductivity type, is formed on the first semiconductor layer and at least one diffusion layer of the first conductivity type is formed from the surface of the second semiconductor layer so as to reach the surface of the first semiconductor layer. The diffusion layer subdivides the second semiconductor layer into a plurality of semiconductor regions At least one photodiode portion for converting signal light into an electrical signal is formed at a junction between at least one of the plurality of semiconductor regions and the first semiconductor layer. A depletion layer which is formed in the first semiconductor layer when a reverse bias voltage is applied to the at least one photodiode portion has a field intensity of about 0.3 V/$\mu$m or more.

21 Claims, 19 Drawing Sheets

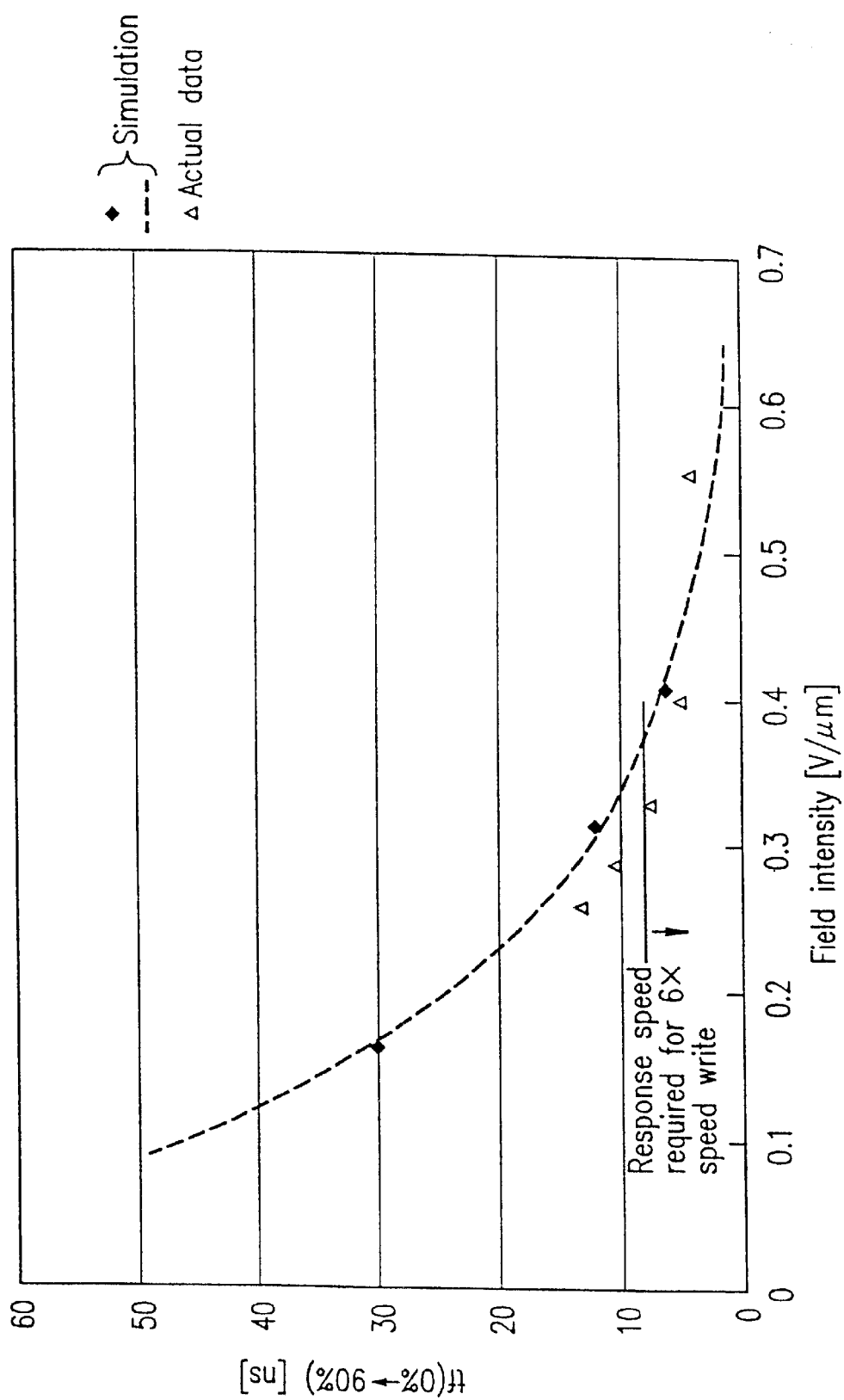

LIGHT SENSITIVE ELEMENT AND LIGHT SENSITIVE ELEMENT HAVING INTERNAL CIRCUITRY

BACKGROUND OF THE INVENTION

1. Field of the Invention

The present invention relates to a photosensitive device, as well as a photosensitive device having internal circuitry, for use in an optical pickup or the like which supports write operations.

2. Description of the Related Art

Optical pickups are employed for optical disk apparatuses, e.g., CD-ROM or DVD (digital video disk) apparatuses. In recent years, optical disk apparatuses have been increasing in operation speed, and there has been a trend for processing a large amount of data, e.g., moving image data, at higher speeds. Against such a background, there has been an intense demand for increasing the operation speed of optical pickups.

Over the past years, optical disk apparatuses which are capable of writing data on optical disks, e.g., CD-R/RW and DVD-R/RAM, have been developed. Such an optical disk apparatus which is capable of write operations writes information on an optical disk by causing a phase change in a dye which is provided on the disk based on laser-induced heat. High power laser light is radiated onto an optical disk, and light reflected therefrom is incident on a photodiode. Therefore, a much greater amount of laser light is radiated onto the photodiode at the time of writing than at the time of reading. Such writable optical disk media have also been subjected to intense demands for faster operation.

FIGS. 1A and 1B illustrate the structure of a conventional photodiode 1000 which is disclosed in Japanese Laid-Open Publication No 9-153605. As shown in FIG. 1A, this photodiode 1000 includes an epitaxial layer 85 of a second conductivity type provided on a semiconductor substrate 84 of a first conductivity type. The epitaxial layer 85 of the second conductivity type is subdivided into a plurality of regions by diffusion layers 87 and 88 of the first conductivity type. A junction between each subdivided region and the underlying portion of the semiconductor substrate 84 of the first conductivity type provides the photodiode 1000.

The response speed of the conventional photodiode 1000 of the aforementioned structure is a function of a CR time constant, which in turn is a function of the capacitance (C) and the resistance (R) of the photodiode, and the migration distance of carriers, which are generated on the side of a depletion layer 86 closer to the substrate 84, migrating via diffusion.

Therefore, according to this conventional technique, the impurity concentration within the semiconductor substrate 84 of the first conductivity type is prescribed at a low level as shown in FIG. 1B, which illustrates the impurity concentration profile of a cross-section along line I–I' in FIG. 1A, so as to obtain a large expanse of the depletion layer 86 within the semiconductor substrate 84 of the first conductivity type. As a result, the junction capacitance of the photodiode 1000 is reduced, thereby decreasing the CR time constant and hence increasing the response speed of the photodiode 1000. Furthermore, since the depletion layer 86 extends deeply into the substrate 84, carriers which are generated at relatively deep portions within the substrate 84 will not have to travel over a large distance via diffusion, thereby also increasing the response speed of the photodiode 1000.

The C component in the CR time constant, which determines the response speed of the photodiode, can also be reduced by increasing the resistivity of the substrate 84 up to a certain value. Thus, as shown in FIG. 2, the response speed (i.e., cut off frequency) of the photodiode can be improved until the resistivity of the substrate 84 reaches that value. However, increasing the resistivity of the substrate 84 further above that value will result in an increase in the serial resistance of the anode side (which contributes to an increase in the R component), so that the response speed of the photodiode, as a function of the CR time constant, is decreased rather than increased, as shown in FIG. 2.

Accordingly, in order to further enhance the response speed of a photodiode, Japanese Laid-Open Publication No. 61-154063, for example, proposes a photosensitive device 2000 having a structure as shown in FIG. 3, where a photodiode is constructed on a laminate substrate obtained by forming a P-type high resistance crystal growth layer 142 on a P-type low resistance substrate 141.

The photosensitive device 2000 shown in FIG. 3 includes an N-type epitaxial layer 143, a P-type separation diffusion layer 144, an N-type contact region 145, an N-type embedded region 146, a P-type base region 147, an N-type emitter region 148, a silicon oxide film 149, electrode wiring layers 150a, 150b, and 150c, a photodiode structural portion 180 for detecting signal light, and a circuit structural portion 190 for processing a detected signal.

A high resistance crystal growth layer 142 includes an autodope layer 142a, which has a gradually decreasing impurity concentration beginning from the low resistance substrate 141, and a layer 142b, which has a constant impurity concentration. According to this conventional technique, the high resistance crystal growth layer 142 makes it easy for the depletion layer 160 to expand into the substrate 141, thereby reducing the junction capacitance. Furthermore, the serial resistance on the anode side is reduced by the P-type low resistance substrate 141, which lies much below the expanse of the depletion layer 160. As a result, both the C component and the R component (which determine the response speed) of the photodiode are reduced, thereby enhancing the response speed of the photosensitive device 2000.

In order to improve the response speed of a photodiode by employing the aforementioned laminate substrate, it is necessary to reduce the junction capacitance by allowing the depletion layer 160 to adequately expand into the high resistance crystal growth layer 142. Therefore, it is desirable to increase the resistivity of the high resistance crystal growth layer 142 up to 1000 Ωcm, which corresponds to the maximum controllable resistivity under epitaxial growth, and to prescribe the thickness of the high resistance crystal growth layer 142 at about 20 $\mu$m (where the constant impurity concentration portion 142b of the high resistance layer would be about 13 $\mu$m thick) so that the depletion layer 160 fully expands in the constant impurity concentration portion 142b of the high resistance layer. Any increase in the region into which the high resistance crystal growth layer 142 does not expand would cause an increase in the serial resistance on the anode side, which in turn prevents the improvement of response speed.

In the case of an optical pickup which supports write operations, the amount of light which is radiated by a laser onto an optical disk increases in proportion with the writing speed, whereby the amount of laser light which is reflected from the optical disk and enters the photodiode also increases. If the amount of light entering the photodiode exceeds a certain level, the response speed of the photodiode may deteriorate.

FIG. 4 shows the dependency of the response speed (i.e., cut off frequency) of the photodiode having the structure shown in FIG. 1 on the incident light amount. As seen from FIG. 4, the response speed (i.e., cut off frequency) of the photodiode decreases as the amount of light entering the photodiode exceeds a certain level. It can also be seen that such a decrease in the response speed becomes more prominent as the resistivity of the substrate increases.

SUMMARY OF THE INVENTION

According to the present invention, there is provided a photosensitive device including: a semiconductor substrate of a first conductivity type; a semiconductor layer of the first conductivity type formed on the semiconductor substrate and having a lower impurity concentration than that of the semiconductor substrate; a semiconductor layer of a second conductivity type formed on the semiconductor layer of the first conductivity type; and at least one diffusion layer of the first conductivity type formed from the surface of the semiconductor layer of the second conductivity type so as to reach the surface of the semiconductor layer of the first conductivity type, the at least one diffusion layer subdividing the semiconductor layer of the second conductivity type into a plurality of semiconductor regions of the second conductivity type, wherein at least one photodiode portion for converting signal light into an electrical signal is formed at a junction between at least one of the plurality of semiconductor regions of the second conductivity type and the semiconductor layer of the first conductivity type, and wherein a depletion layer which is formed in the semiconductor layer of the first conductivity type when a reverse bias voltage is applied to the at least one photodiode portion has a field intensity of about 0.3 V/μm or more.

In one embodiment of the invention, the depletion layer formed in the semiconductor layer of the first conductivity type has a thickness of about 5 μm or more.

In another embodiment of the invention, the semiconductor layer of the first conductivity type has a thickness of about 13 μm to about 17 μm and a resistivity of about 100 Ωcm to about 1500 Ωcm.

In still another embodiment of the invention, the semiconductor substrate has a resistivity of about 1 Ωcm to about 20 Ωcm.

In still another embodiment of the invention, the photosensitive device further includes: a first electrode provided on a back face of the semiconductor substrate: a second electrode provided on the surface of the semiconductor layer of the second conductivity type, wherein the first and second electrodes are electrically coupled to each other.

In still another embodiment of the invention, the plurality of semiconductor regions of the second conductivity type include at least one first region defining the at least one photodiode portion and at least one second region discrete from the at least one first region, and a signal processing circuitry portion for processing the electrical signal is provided in the at least one second region.

In still another embodiment of the invention, the photosensitive device further includes a high concentration diffusion layer of the first conductivity type formed at an interface between the at least one second region and the first semiconductor layer of the first conductivity type.

Alternatively, there is provided a photosensitive device including: a semiconductor substrate of a first conductivity type; a first semiconductor layer of the first conductivity type formed on the semiconductor substrate and having a higher impurity concentration than that of the semiconductor substrate; a second semiconductor layer of the first conductivity type formed on the first semiconductor layer of the first conductivity type and having a lower impurity concentration than that of the semiconductor substrate; a semiconductor layer of a second conductivity type formed on the second semiconductor layer of the first conductivity type; and at least one diffusion layer of the first conductivity type formed from the surface of the semiconductor layer of the second conductivity type so as to reach the surface of the second semiconductor layer of the first conductivity type, the at least one diffusion layer subdividing the semiconductor layer of the second conductivity type into a plurality of semiconductor regions of the second conductivity type, wherein at least one photodiode portion for converting signal light into an electrical signal is formed at a junction between at least one of the plurality of semiconductor regions of the second conductivity type and the second semiconductor layer of the first conductivity type.

In one embodiment of the invention, a depletion layer which is formed in the second semiconductor layer of the first conductivity type when a reverse bias voltage is applied to the at least one photodiode portion has a field intensity of about 0.3 V/μcm or more.

In another embodiment of the invention, the second semiconductor layer of the first conductivity type has a thickness of about 9 μm to about 17 μm and a resistivity of about 100 Ωcm to about 1500 Ωcm.

In still another embodiment of the invention, the semiconductor substrate has an impurity concentration equal to or smaller than about 1/100 of a peak impurity concentration in the first semiconductor layer of the first conductivity type.

In still another embodiment of the invention, the semiconductor substrate is produced by a CZ method and has a resistivity of about 20 Ωcm to about 50 Ωcm.

In still another embodiment of the invention, the first semiconductor layer of the first conductivity type has a peak impurity concentration of about $1 \times 10^{17}$ cm$^{-3}$ or more.

In still another embodiment of the invention, the first semiconductor layer of the first conductivity type is formed by being applied and diffused.

In still another embodiment of the invention, the first semiconductor layer of the first conductivity type has a region of an increasing impurity concentration from the semiconductor substrate toward the surface of the semiconductor layer of the second conductivity type, and a portion having about 1/100 of the highest impurity concentration throughout the first semiconductor layer of the first conductivity type exists at a depth of about 38 μm or less from the surface of the semiconductor layer of the second conductivity type.

In still another embodiment of the invention, the plurality of semiconductor regions of the second conductivity type include at least one first region defining the at least one photodiode portion and at least one second region discrete from the at least one first region, and a signal processing circuitry portion for processing the electrical signal is provided in the at least one second region.

In still another embodiment of the invention, the photosensitive device further includes a high concentration diffusion layer of the first conductivity type formed at an interface between the at least one second region and the second semiconductor layer of the first conductivity type.

Thus, the invention described herein makes possible the advantages of (1) providing a photosensitive device for use in an optical pickup which supports write operations such that the photosensitive device provides an improved response speed both when receiving a small amount of light during a read operation and when receiving a large amount of light during a write operation; and (2) providing such a photosensitive device having internal circuitry.

Hereinafter, the effects of the present invention will be described.

A photosensitive device according to the present invention incorporates a laminate substrate which includes a semiconductor substrate of a first conductivity type and a semiconductor layer of the first conductivity type formed thereon and having a lower impurity concentration than that of the semiconductor substrate. As a result, the capacitance and the anode resistance of the photodiode are reduced, thereby improving the response speed at the time of receiving a small amount of light during a read operation. In order to prevent a decrease in the response speed due to a flattened potential distribution which would conventionally occur when receiving a large amount of light during a write operation, the depletion layer thickness is controlled by reducing the thickness of the semiconductor layer of the first conductivity type, thereby enhancing the field intensity within the depletion layer. The field intensity within the depletion layer is prescribed at about 0.3 V/$\mu$m or more in view of the response speed requirement at the time of receiving a large amount of light (e.g., during a 6× speed write operation), which must be satisfied by a photodiode that supports write operations. Furthermore, the depletion layer thickness is prescribed at about 5 $\mu$m or more in view of the response speed requirement at the time of receiving a small amount of light (e.g., during a 32× speed read operation), which must be satisfied by a photodiode that supports write operations.

In order to satisfy such requirements, it is preferable that the semiconductor layer of the first conductivity type has a thickness (including that of an autodope layer) of about 13 $\mu$m to about 17 $\mu$m and a resistivity of about 100 $\Omega$cm to about 1500 $\Omega$cm.

In order to improve the response speed of the photodiode by reducing the anode resistance, it is preferable to minimize the resistivity of the substrate. However, an excessively small resistivity of the substrate would result in autodoping of impurities from the substrate into the semiconductor layer of the first conductivity type during a crystal growth process of the semiconductor layer of the second conductivity type, thereby decreasing the response speed. Such influence of an autodope layer can be minimized to a negligible level by ensuring that the semiconductor substrate has a resistivity of about 1 $\Omega$cm to about 20 $\Omega$cm.

By providing an anode electrode on the back face of the semiconductor substrate, the anode electrode being electrically coupled to an anode electrode provided on a separation diffusion region located near the surface, the anode resistance can be further reduced as compared to the case where an anode electrode is provided only at the surface of the photosensitive device.

According to another aspect of the invention, a laminate substrate is employed which includes a semiconductor substrate of a first conductivity type and a first semiconductor layer of the first conductivity type formed thereon and having a higher impurity concentration than that of the semiconductor substrate, and which additionally includes a second semiconductor layer of the first conductivity type formed on the first semiconductor layer of the first conductivity type and having a lower impurity concentration than that of the semiconductor substrate. Since the first semiconductor layer of the first conductivity type can serve as a potential barrier as viewed from the substrate, carriers generated on the substrate side of the first semiconductor layer of the first conductivity type cannot override the first semiconductor layer of the first conductivity type to reach the PN junction, and will disappear through recombination within the substrate. As a result, a slow current component associated with the carriers generated within the substrate can be eliminated, thereby increasing the response speed. Since the concentration difference between the first semiconductor layer of the first conductivity type and the second semiconductor layer of the first conductivity type is increased, the field intensity is enhanced, whereby the response speed is improved.

The field intensity within the depletion layer is preferably prescribed at about 0.3 V/$\mu$m or more in view of the response speed requirement at the time of receiving a large amount of light (e.g., during a 12× speed write operation), which is required of a photodiode that supports write operations.

Furthermore, the thickness of the second semiconductor layer of the first conductivity type is preferably prescribed at a value between about 9 $\mu$m and about 17 $\mu$m, and the resistivity of the second semiconductor layer of the first conductivity type is preferably prescribed at a value between about 100 $\Omega$cm and about 1500 $\Omega$cm, in view of the response speed requirement at the time of receiving a large amount of light (e.g., during a 12× speed write operation), which is required of a photodiode that supports write operations. The depletion layer thickness is preferably about 3 $\mu$m or more, in view of the response speed requirement at the time of receiving a small amount of light.

By prescribing the impurity concentration in the semiconductor substrate of the first conductivity type at about 1/100 or less of the peak impurity concentration within the first semiconductor layer of the first conductivity type, it becomes possible to sufficiently reduce the number of carriers generated on the substrate side of the first semiconductor layer of the first conductivity type at the time of receiving a large amount of light which override the first semiconductor layer of the first conductivity type to reach the PN junction.

It is preferable to produce the semiconductor substrate of the first conductivity type by using a CZ method, which is unlikely to produce defective products. By prescribing the resistivity of the substrate at the highest possible resistivity that can be obtained by a CZ method, e.g., about 20 $\Omega$cm to about 50 $\Omega$cm, it is possible to increase the level of the potential barrier on the substrate side in the first semiconductor layer of the first conductivity type. As a result, it becomes possible to sufficiently reduce the number of carriers generated within the substrate which override the first semiconductor layer of the first conductivity type, thereby increasing the response speed.

It is preferable that the first semiconductor layer of the first conductivity type has a peak impurity concentration of about $1 \times 10^{17\ cm-3}$ or more, so as to retain a sufficiently high impurity concentration (100 times or greater) relative to the substrate.

It is preferable that the first semiconductor layer of the first conductivity type is produced by being applied and then diffused, which technique is unlikely to produce defective products.

In a region within the first semiconductor layer of the first conductivity type where the increasing impurity concentration increases from the semiconductor substrate toward the surface, it is effective, for the sake of improving the response speed, to ensure that about 1/100 of the highest impurity concentration throughout the first semiconductor layer of the first conductivity type exists at a depth of about 38 µm or less from the surface.

A photosensitive device having internal circuitry according to the present invention includes a signal processing circuitry portion for processing a detected signal that is provided in a region of the semiconductor layer of the second conductivity type separated from the photodiode portions by diffusion layers of the first conductivity type. As a result, the overall pickup system can be downsized.

By providing a high concentration diffusion layer of the first conductivity type below the signal processing circuitry portion and the P-type separation diffusion layer coupled to an anode electrode in the vicinity of the photodiode portion, beginning from the surface of the first or second semiconductor layer of the first conductivity type, it is possible to prescribe a low anode resistance which is required for achieving the response speed at the time of receiving a large amount of light, as a requirement for a photodiode that supports write operations. It also becomes possible to prevent a latch-up phenomenon of the circuitry.

This and other advantages of the present invention will become apparent to those skilled in the art upon reading and understanding the following detailed description with reference to the accompanying figures.

BRIEF DESCRIPTION OF THE DRAWINGS

FIG. 9 is a graph illustrating simulated results and actual measurements showing the relationship between the response time and the field intensity within a depletion layer of a photodiode.

DESCRIPTION OF THE PREFERRED EMBODIMENTS

Hereinafter, the present invention will be described by way of illustrative examples, with reference to the accompanying figures.

Figure 1A:
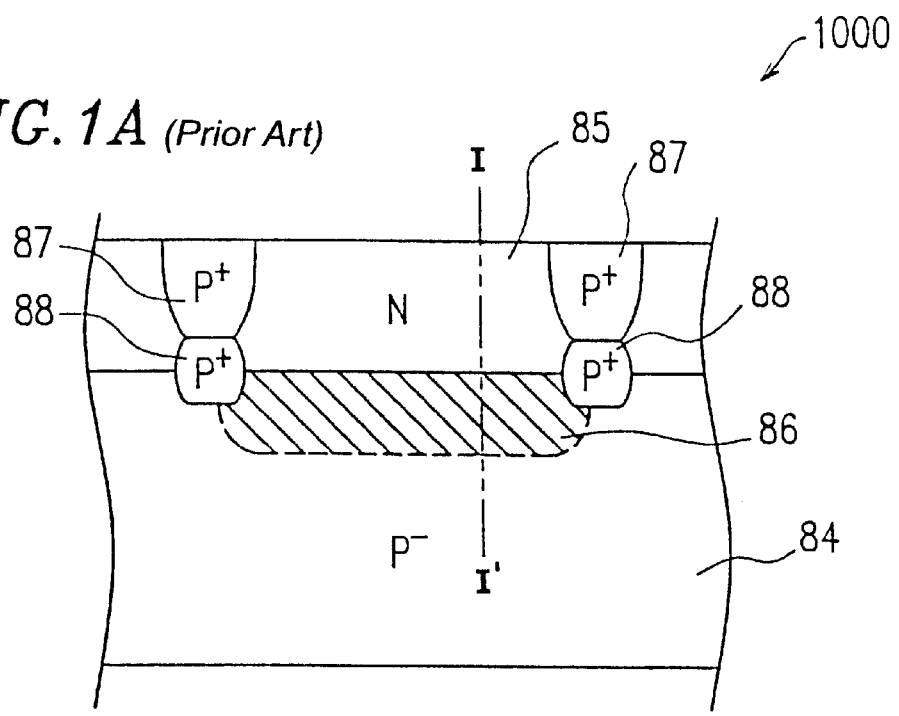
FIG. 1A is a cross-sectional view illustrating a conventional photodiode.
Figure 1B:
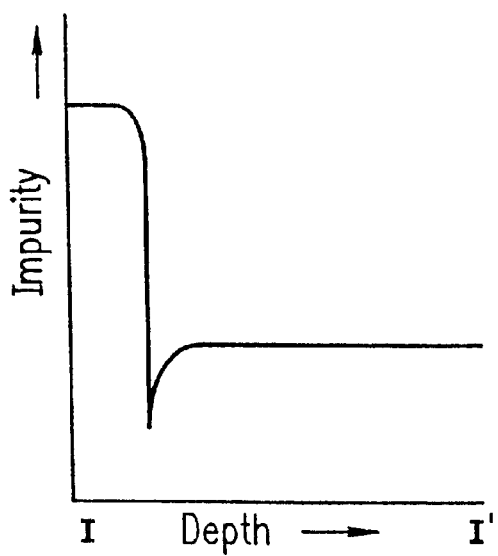
FIG. 1B is a graph showing the impurity concentration distribution along line I–I' in FIG. 1A.
Figure 2:
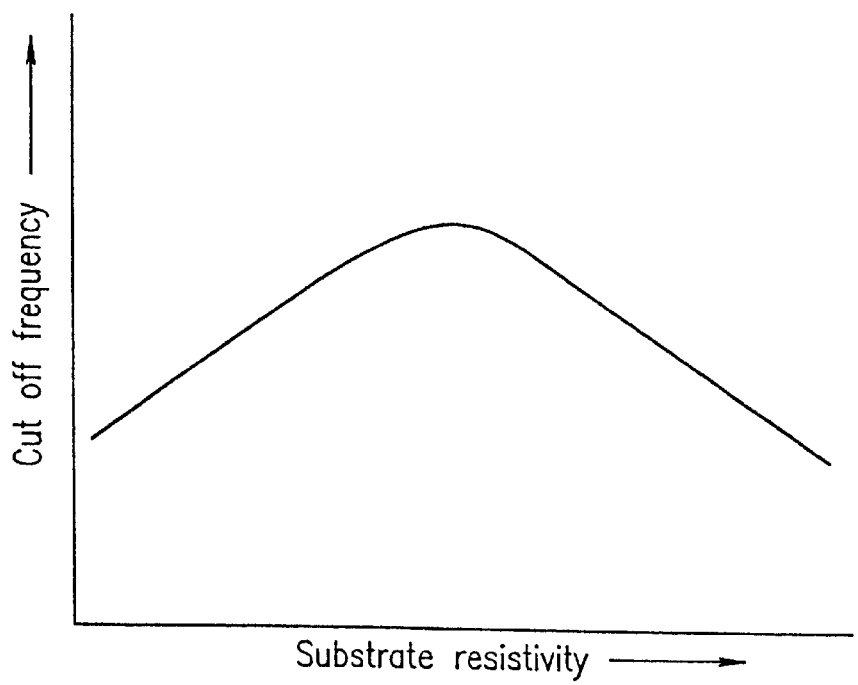
FIG. 2 is a graph showing the relationship between the resistivity of a substrate and the response speed (cutoff frequency) of a conventional photosensitive device.
Figure 3:
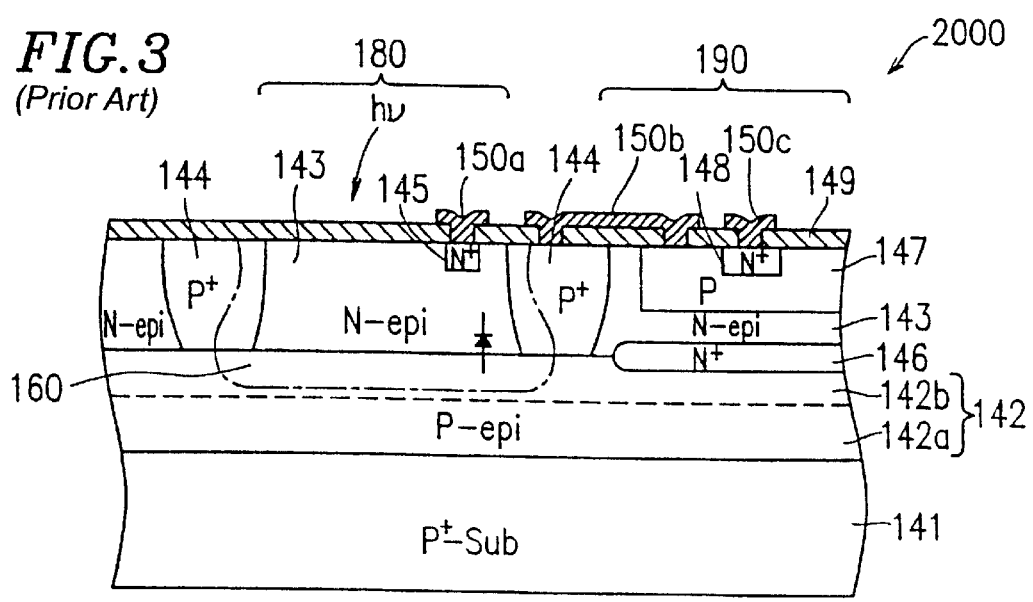
FIG. 3 is a cross-sectional view illustrating a conventional photosensitive device.

As mentioned earlier, when a conventional photodiode having the structure shown in FIG. 1 or 3 is used as a photodiode for write operations, there is a problem in that its response speed may deteriorate when receiving a large amount of light.

Figure 5:
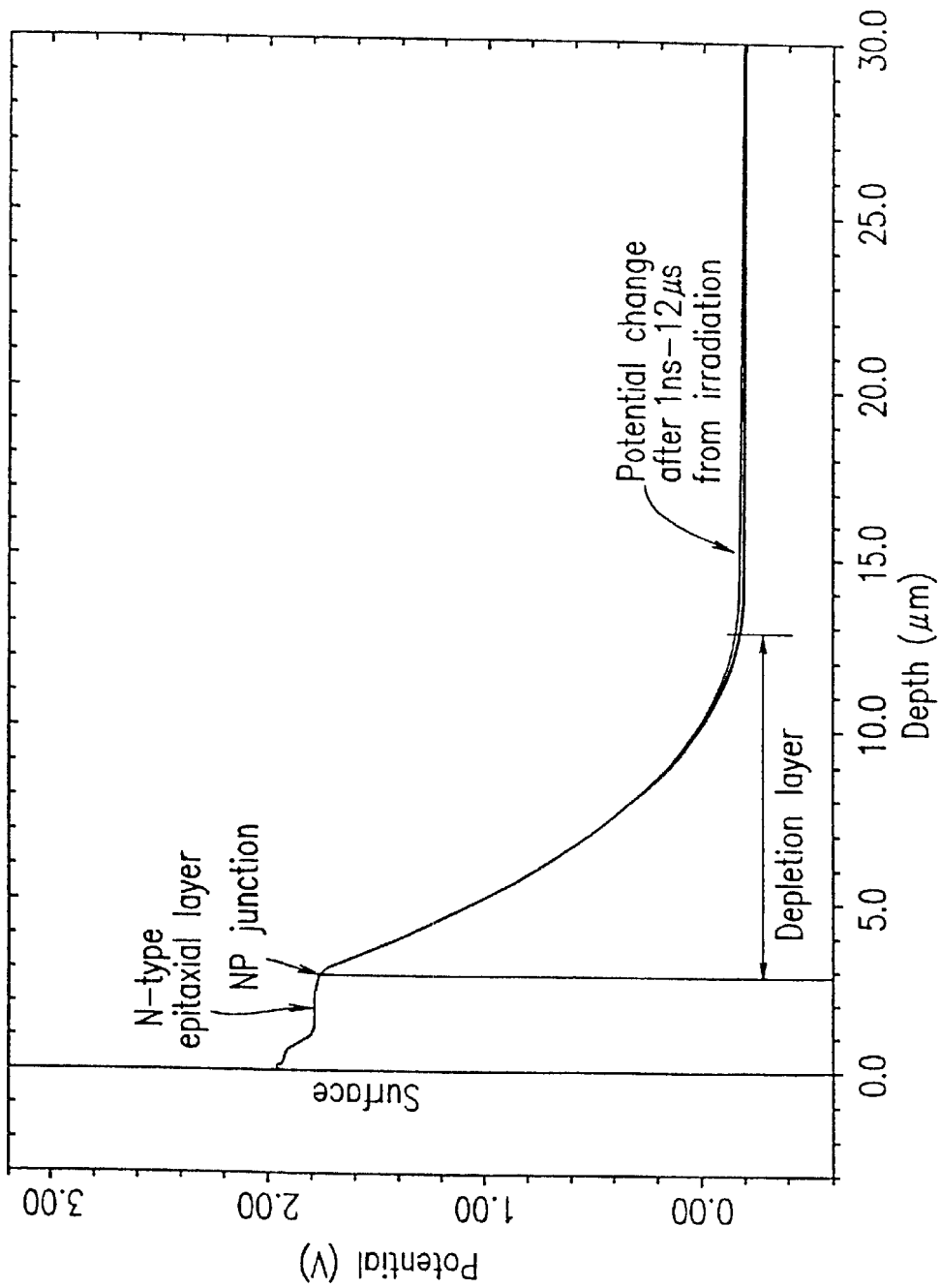
FIG. 5 is a graph illustrating simulation results of temporal changes in the potential level within the photodiode in the photosensitive device of the structure shown in FIGS. 1A and 1B, with respect to the case where a small amount of light is received by the photodiode.
Figure 6:
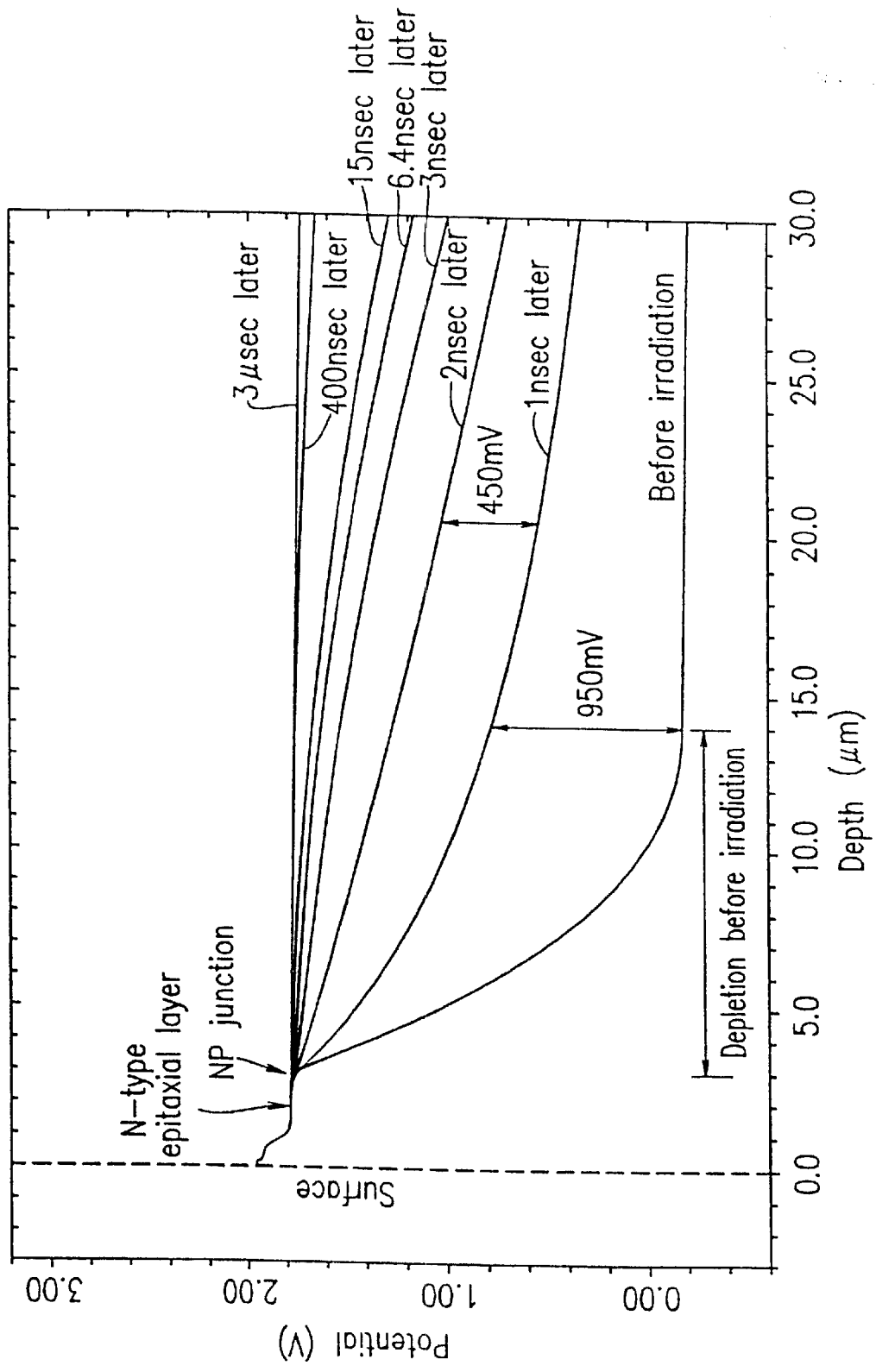
FIG. 6 is a graph illustrating simulation results of temporal changes in the potential level within the photodiode in the photosensitive device of the structure shown in FIGS. 1A and 1B, with respect to the case where a large amount of light is received by the photodiode.
Figure 7:
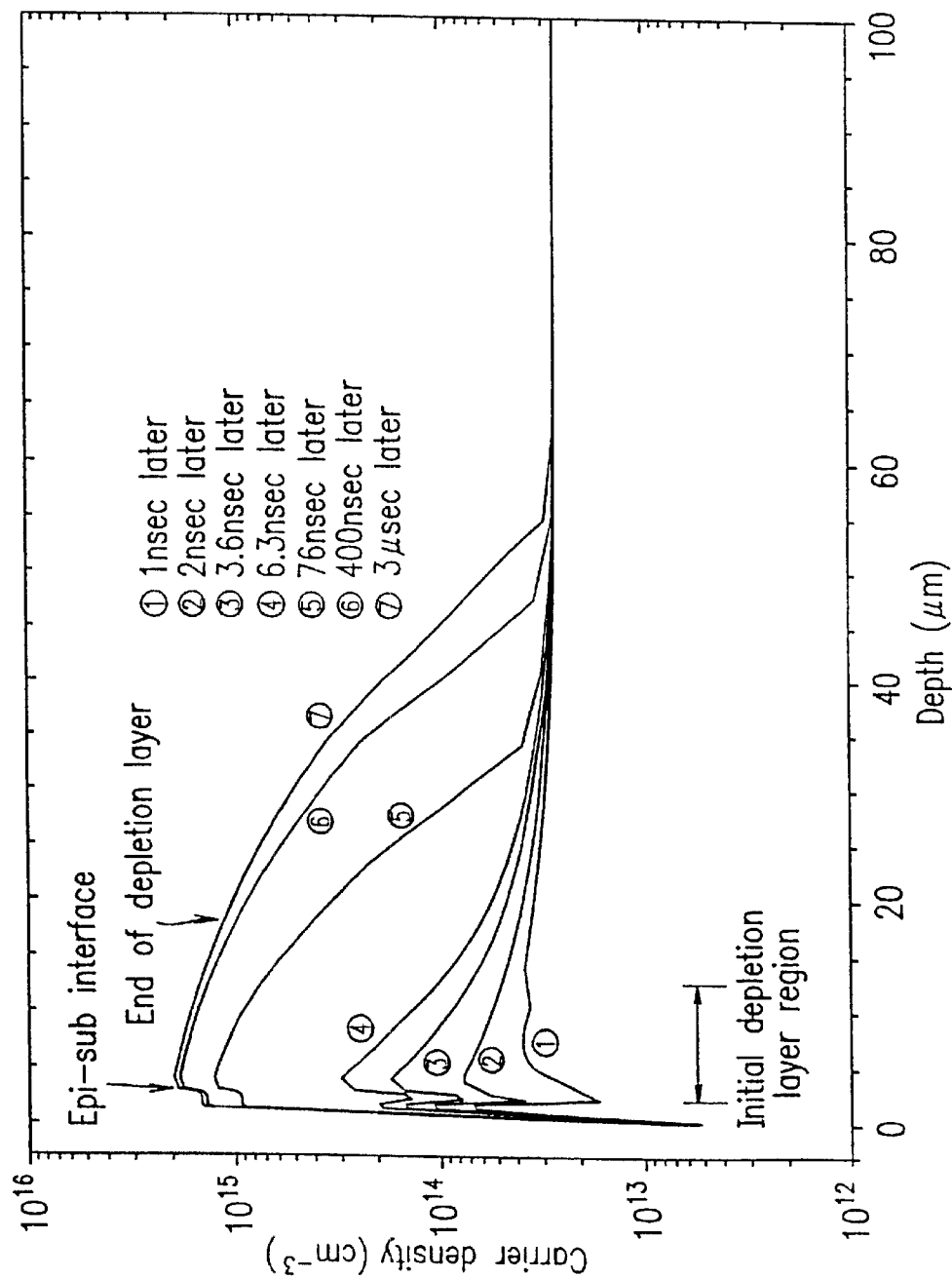
FIG. 7 is a graph illustrating simulation results of temporal. changes in the carrier density distribution within the photodiode in the photosensitive device of the structure shown in FIGS. 1A and 1B, with respect to the case where a small amount of light is received by the photodiode.

The inventors have analyzed through device simulations the temporal change of carrier density and potentials when a large amount of light is received by a photodiode. As a result of the simulation, it was learned that the decrease in the response speed occurs as follows. The large number of carriers which are generated at the time of receiving a large amount of light are accumulated in the vicinity of the junction, causing the potentials distribution to become flattened and hence resulting in a weaker force to drive the carriers toward the junction, so that the carriers will migrate, if at all, only via diffusion. FIGS. 5 and 6 illustrate simulation results of temporal changes in the potential level within the photodiode, with respect to the case where a small amount of light is received by the photodiode as in a read operation (FIG. 5), and the case where a large amount of light is received by the photodiode as in a 6× speed write operation (FIG. 6). FIG. 7 illustrate a simulation result of temporal changes in the carrier density with respect to the case where a large amount of light is received by the photodiode. Note that the simulation results of FIGS. 5 to 7 were obtained by using the conventional structure shown in FIG. 1.

As seen from FIG. 5, no potential change occurs in the vicinity of the junction when a small amount of light is received. On the other hand, as seen from FIG. 6, the substrate potential increases with the lapse of time following the incidence of light. Moreover, FIG. 7 shows that carriers are accumulated in the vicinity of the PN junction and in the substrate when a large amount of light is received. This is because a large number of carriers are generated in the depletion layer and in the substrate when a large amount of light is received, thereby increasing the substrate potential. Since the field intensity is reduced in the vicinity of the junction, there is less force to drive the carriers, allowing more carriers to be accumulated, so that the substrate potential again increases. Through such repetitions, the potential distribution in the vicinity of the junction becomes flattened, so that the carriers will have to migrate over a long distance via diffusion, which is the cause for the reduced response speed.

Hereinafter, it will be described how the inventors analyzed the cause for the accumulation of carriers and arrived at the present invention.

Figure 4:
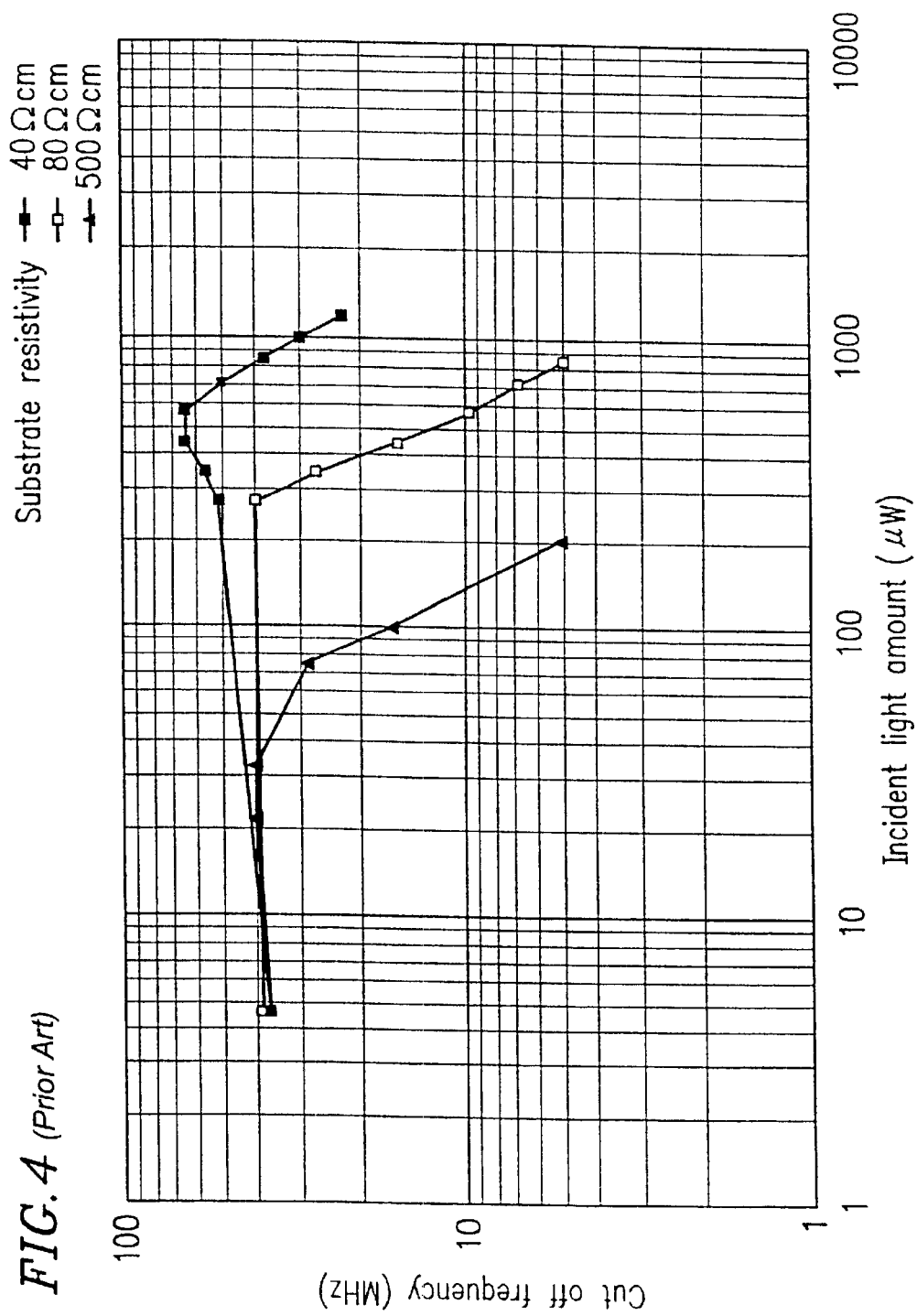
FIG. 4 is an experimentally-obtained graph showing the dependency of the response speed (i.e., cut off frequency) of the photodiode having the structure shown in FIGS. 1A and 1B on the incident light amount.

From FIG. 4 as described above, it can be seen that the rate of decrease in the response speed at the time of receiving a large amount of light becomes smaller as the resistivity of the substrate becomes lower. Since the same reverse bias voltage is applied, the thickness of the depletion layer becomes smaller as the resistivity of the substrate becomes lower, so that a more intense electric field is applied across the depletion layer. As a more intense electric field is applied, there is a stronger force to drive the carriers out from the vicinity of the junction, which prevents accumulation of the carriers. This is presumably the reason why a faster response speed at the time of receiving a large amount of light is provided as the resistivity of the substrate is reduced, despite the decrease in the thickness of the depletion layer.

Figure 8A:
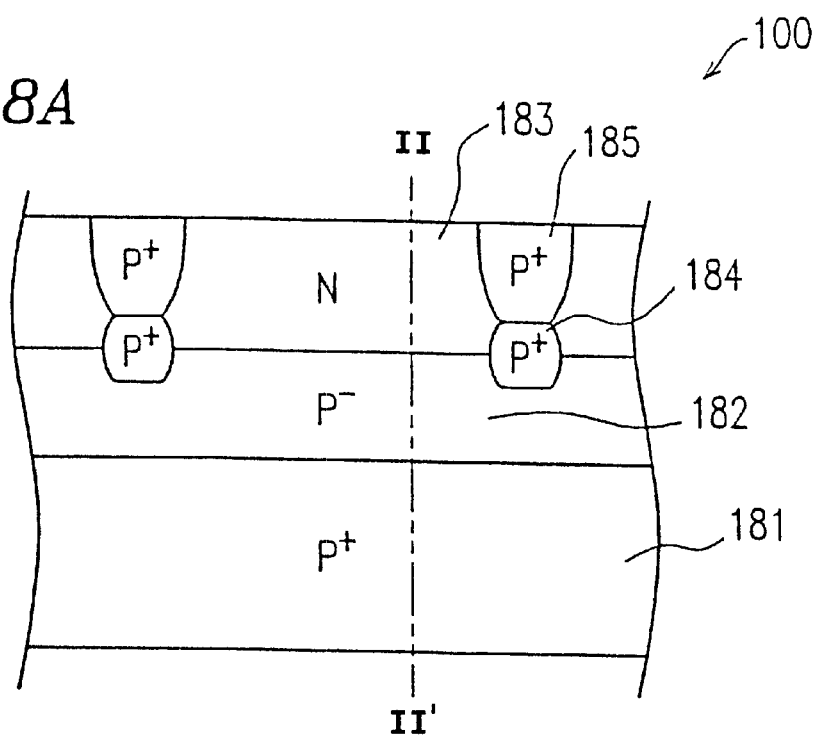
FIG. 8A is a cross-sectional view illustrating a photodiode according to the present invention, used for a simulation conducted by the inventors.
Figure 8B:
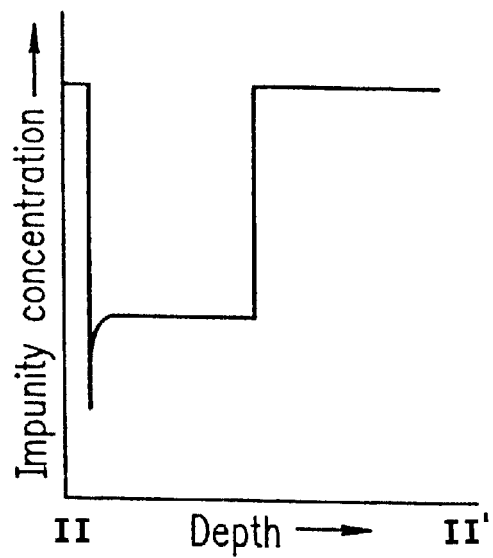
FIG. 8B is a graph showing the impurity concentration distribution along line II–II' in FIG. 8A.

Accordingly, the inventors conducted a device simulation to examine the effects of the field intensity within the depletion layer on the response speed of a photodiode when receiving a large amount of light (350 $\mu$W). This simulation was conducted by using a photodiode 100 having the structure shown in FIG. 8A and an impurity concentration profile shown in FIG. 8B (corresponding to line II–II' in FIG. 8A). The photodiode 100 has a laminate structure including a P-type high resistance layer 182 formed on a P-type low resistance substrate 181, and an N-type semiconductor layer 183 formed on the P-type high resistance layer 182. The N-type semiconductor layer 183 is subdivided into a plurality of regions by P-type diffusion layers 184 and 185. Since the photodiode 100 has an impurity profile shown in FIG. 8B such that the concentration changes in a stepwise manner between the P-type low resistance substrate 181 and the P-type high resistance layer 182, a depletion layer expands to an interface between the substrate 181 and the P-type high resistance layer 182. The resistivity of the substrate is so low that the influence of the anode resistance can be ignored.

The response of the photodiode 100 when a large amount of pulse light is radiated thereto was obtained by a simulation, and the dependency of the response speed on the field intensity was studied by varying the applied reverse bias voltage. FIG. 9 shows a simulation result of the dependency of a response time tf (90%→10%) on the field intensity, where the response time tf (90%→10%) is defined as a period of time which is required, after pulse light is radiated onto the photodiode 100, for the photocurrent to decrease from 90% to 10% of its maximum value. As seen from FIG. 9, the response speed of the photodiode 100 decreases as the field intensity within the depletion layer decreases.

Figure 10A:
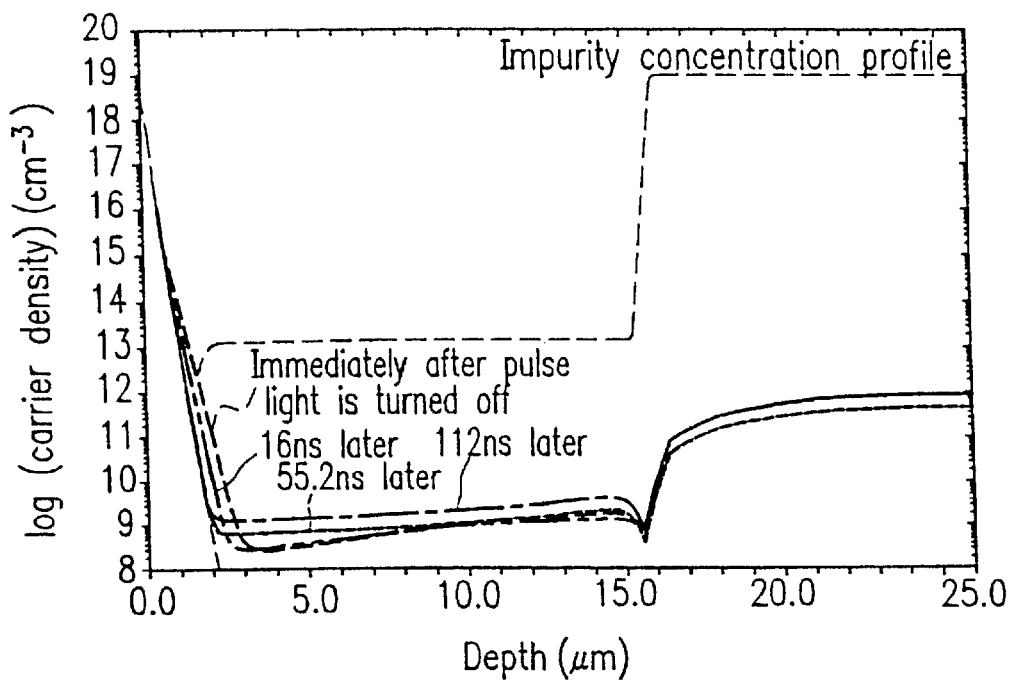
FIGS. 10A and 10B are graphs illustrating the temporal change of the carrier density distribution, with respect to the photodiode in accordance with the photosensitive device having the structure shown in FIG. 8A.
Figure 10B:
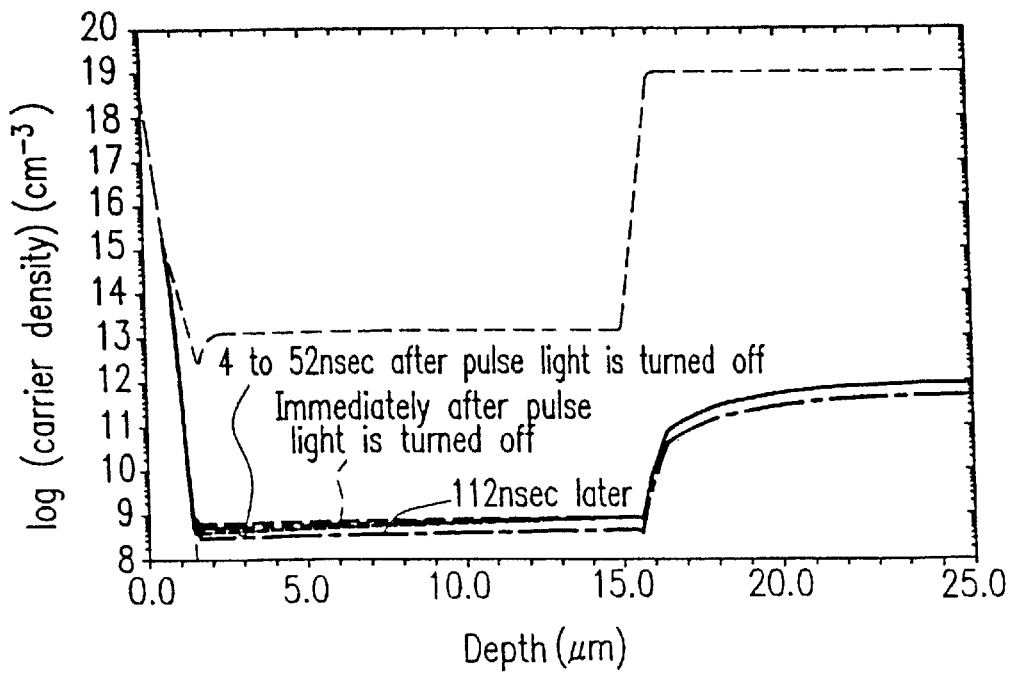

Furthermore, in order to study the cause for the reduced response speed, the inventors examined the temporal change of the carrier density distribution within the photodiode 100 along the depth direction after radiation of pulse light (pulse width: 10 $\mu$sec). The results are shown in FIGS. 10A and 10B. FIG. 10A shows the case where a field intensity of 0.16 V/$\mu$m exists within the depletion layer. FIG. 10B shows the case where a field intensity of 0.4 V/$\mu$m exists within the depletion layer. As seen from FIG. 10A, a large number of carriers are accumulated in the vicinity of the junction (at a depth of about 2 $\mu$m) immediately after the pulse light irradiation in the case of a low field intensity existing within the depletion layer. For example, $10^{12}$ cm$^{-3}$ carriers are accumulated in the immediate vicinity of the junction. The fact that it takes relatively long (e.g., 10 ns or more) for the accumulated carriers to be driven toward the N-type semiconductor layers evidences the reduced response speed. On the other hand, as shown in FIG. 10B, the carrier density in the vicinity of the depletion layer hardly changes, indicative of the absence of carrier accumulation.

Figure 11A:
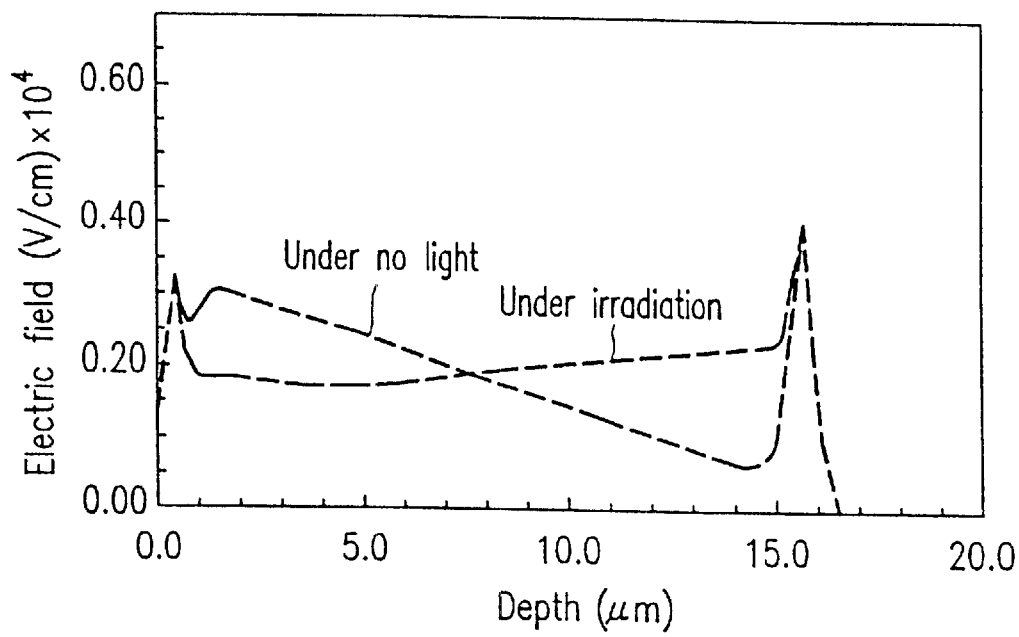
FIGS. 11A and 11B are graphs each illustrating field intensity distribution profiles in the absence of light irradiation and immediately after irradiation of pulse light, with respect to the photodiode in accordance with the photosensitive device having the structure shown in FIG. 8A.
Figure 11B:
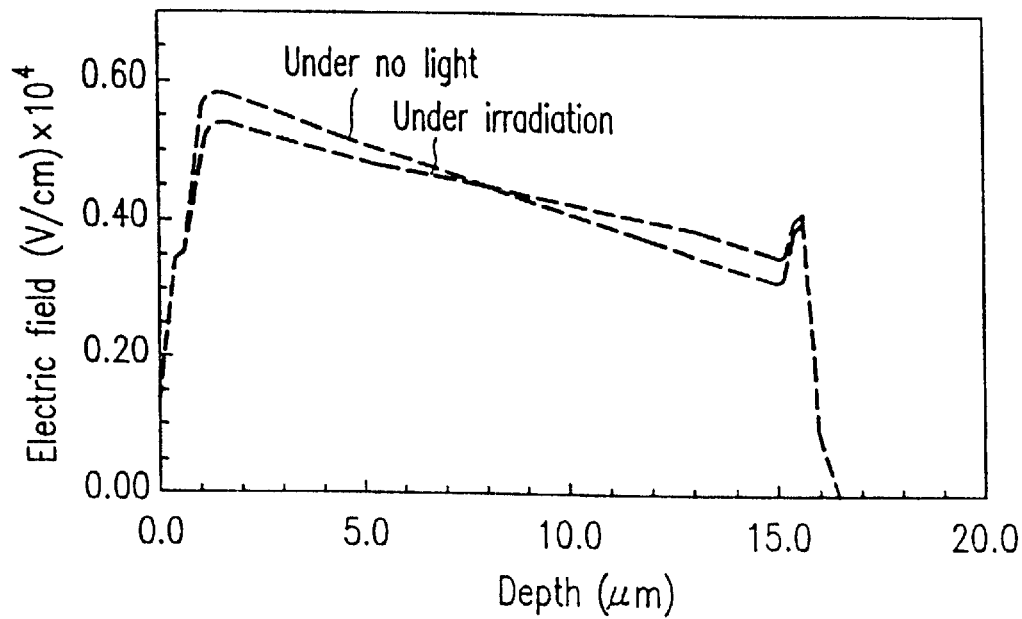

FIGS. 11A and 11B each show field intensity distribution profiles in the absence of light irradiation and immediately after irradiation of pulse light (pulse width: 10 $\mu$sec). As seen from FIG. 11A, the field intensity in the vicinity of the junction is further reduced due to carrier accumulation in the case where there is carrier accumulation with a 0.16 V/$\mu$m field intensity within the depletion layer. The reduced force to drive the accumulated carriers toward the N-type semiconductor layers evidences a greatly reduced response speed. On the other hand, as shown in FIG. 11B, the field intensity within the depletion layer is substantially the same, regardless of whether there is light irradiation or not, in the case where there is no carrier accumulation with a 0.4 V/$\mu$m field intensity within the depletion layer.

Thus, it was found that the cause for the reduced response speed at the time of receiving a large amount of light (i.e., during a write operation) is the accumulation of carriers in the vicinity of the junction, which can be mitigated by increasing the field intensity within the depletion layer.

In actual photodiodes, however, increasing the applied reverse bias voltage in order to increase the field intensity within the depletion layer also increases the noise due to fluctuation of the applied voltage. Therefore, the applied voltage cannot be greatly changed. Another reason why the applied voltage cannot be greatly changed is the fact that such a photodiode shares the same power source with LSI's, if any, within the apparatus.

EXAMPLE 1

Figure 8C:
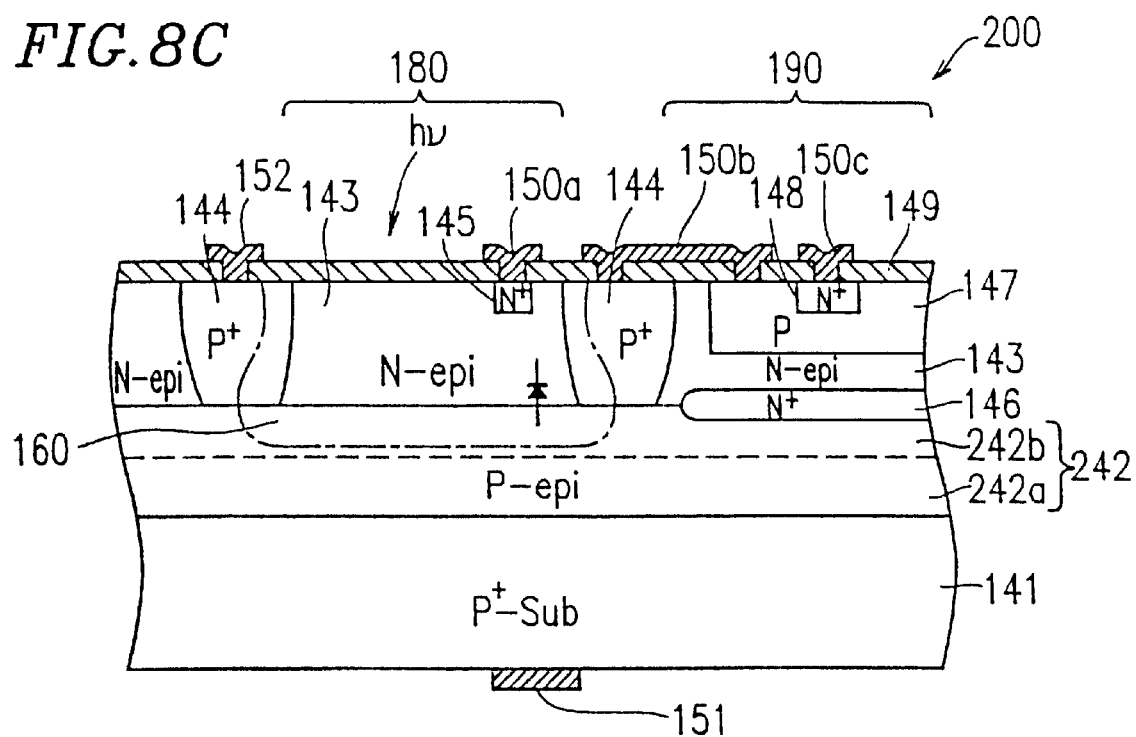
FIG. 8C is a cross-sectional view illustrating a photosensitive device according to Example 1 of the present invention.

FIG. 8C shows a photosensitive device 200 according to Example 1 of the present invention. The elements whose counterparts appear in the photosensitive device 2000 shown in FIG. 3 are denoted by the same reference numerals as those used therein. The photosensitive device 200 has a P-type epitaxial layer 242, which in turn includes an autodope layer 242a having a gradually decreasing impurity concentration beginning from a low resistance substrate 141 and a layer 242b having a constant impurity concentration. In accordance with the photosensitive device 200, the P-type epitaxial layer (P-type high resistance crystal growth layer) 242 is formed so as to be thinner than its counterpart in the conventional photosensitive device 2000 shown in FIG. 3, whereby the depletion layer thickness is limited and the field intensity within the depletion layer is enhanced.

In order to improve the response speed by employing the aforementioned laminate substrate 141, it is necessary to reduce the junction capacitance by allowing the depletion layer 160 to adequately expand into the high resistance layer 242. Accordingly, it is desirable to increase the resistivity of the P-type epitaxial layer 242 to about 1000 Ωcm, which corresponds to the maximum controllable resistivity under epitaxial growth, and prescribe the thickness of the high P-type epitaxial layer 242 at about 20 $\mu$m (where the constant impurity concentration portion 242b of the high resistance layer would be about 13 $\mu$m thick). Any increase in the region in the P-type epitaxial layer 242 in which the depletion layer does not expand would result in an increase in the serial resistance on the anode side, which in turn prevents the improvement of response speed.

The response of actually produced photosensitive devices 200 shown in FIG. 8C, in which the thickness of the P-type epitaxial layer 242 was varied, was measured with respect to the case where a large amount of light is received and the case where a small amount of light is received. The results are shown in Table 1 below. Table 1 also shows the depletion layer thickness and the field intensity within the depletion layer at various thicknesses of the P-type epitaxial layer 242.

TABLE 1

| P-type high resistance epitaxial layer thickness [$\mu$m] | Depletion layer thickness [$\mu$m] | Field intensity within depletion layer [V/$\mu$m] | Small amount of light (10 $\mu$W) fc(−1dB) [Hz] | Large amount of light (350 $\mu$W) tf(90%→10%) [ns] |
|---|---|---|---|---|
| 12.5 | 4.7 | 0.55 | 10 M | 4.1 |
| 15 | 6.5 | 0.40 | 18 M | 4.8 |
| 17.5 | 7.9 | 0.33 | 20 M | 7.6 |
| 20 | 9 | 0.29 | 25 M | 10.5 |
| 22.5 | 10 | 0.26 | 38 M | 12.3 |
| Required ability (6 × speed write, 32 × speed read) | | | 15 M or above | 8 or below |

Since the P-type epitaxial layer 242 includes a region having a varying impurity concentration (i.e., the autodope layer 242a), the depletion layer thickness becomes smaller than the thickness of the P-type epitaxial layer 242 as shown in Table 1.

FIG. 9 shows actual measurement values indicating the relationship between the response speed at the time of receiving a large amount of light and the field intensity within the depletion layer as related to the measurement conditions illustrated in Table 1. As shown in FIG. 9, the response speed increases as the field intensity within the depletion layer increases, with a level of dependency that matches the aforementioned simulated results. Thus, it can be seen that the response speed at the time of receiving a large amount of light is largely determined by the field intensity within the depletion layer, and hardly by the depletion layer thickness. This is also in line with the supposed great dependency of the carrier accumulation on the field intensity in the vicinity of the junction, because the carrier accumulation occurs in the vicinity of the junction (at a depth of about 2 $\mu$m) as seen from FIG. 10A (which illustrates the carrier distribution in the case where the response speed is deteriorated in the aforementioned simulations).

On the other hand, as seen from Table 1 above, the response speed at the time of receiving a small amount of light decreases as the depletion layer thickness decreases. This is because a decrease in the depletion layer thickness causes an increase in the capacitance component and an increase in the distance over which the carriers generated below the depletion layer migrate via diffusion.

As discussed above, the response speed of the photosensitive device 200 of the structure shown in FIG. 8C at the time of receiving a large amount of light can be improved by increasing the field intensity within the depletion layer by reducing the thickness of the P-type epitaxial layer 242. However, an excessive reduction in the thickness of the P-type epitaxial layer 242 would result in a decrease in the response speed at the time of receiving a small amount of light. Therefore, it is necessary to optimize the thickness of the P-type epitaxial layer 242 in terms of both the required response speed at the time of receiving a large amount of light (as in a write operation) and the required response speed at the time of receiving a small amount of light (as in a read operation).

The structure of the photosensitive device 200 shown in FIG. 8C will be described in more detail.

The photosensitive device 200 according to the present example of the invention can be produced by the same method for producing the conventional photosensitive device 2000 having the structure shown in FIG. 3. Characteristic differences of the photosensitive device 200 according to the present example lie in the thickness and resistivity of the P-type epitaxial layer (P-type high resistance crystal growth layer) 242. The thickness and resistivity of the P-type epitaxial layer 242 are set so as to satisfy the following formula:

$$Ed \geq 0.3 \text{ V}/\mu m$$

where Ed represents an average field intensity that is generated within the depletion layer 160 when an operation reverse bias voltage is applied to the photosensitive device 200.

The reasons for prescribing the field intensity within the depletion layer in the above manner are as follows. By increasing the field intensity within the depletion layer, the force to drive photocarriers existing in the vicinity of the junction is increased so as to minimize the decrease in the response speed due to carrier accumulation at the time when the photosensitive device 200 receives a large amount of light. Currently, a 6× speed writing ability is a requirement for a CD pickup which supports write operations. As seen from FIG. 9 described above, a response speed which is necessary for the 6× speed writing ability can be realized by prescribing the field intensity within the depletion layer at about 0.3 V/μm or more.

Figure 12:
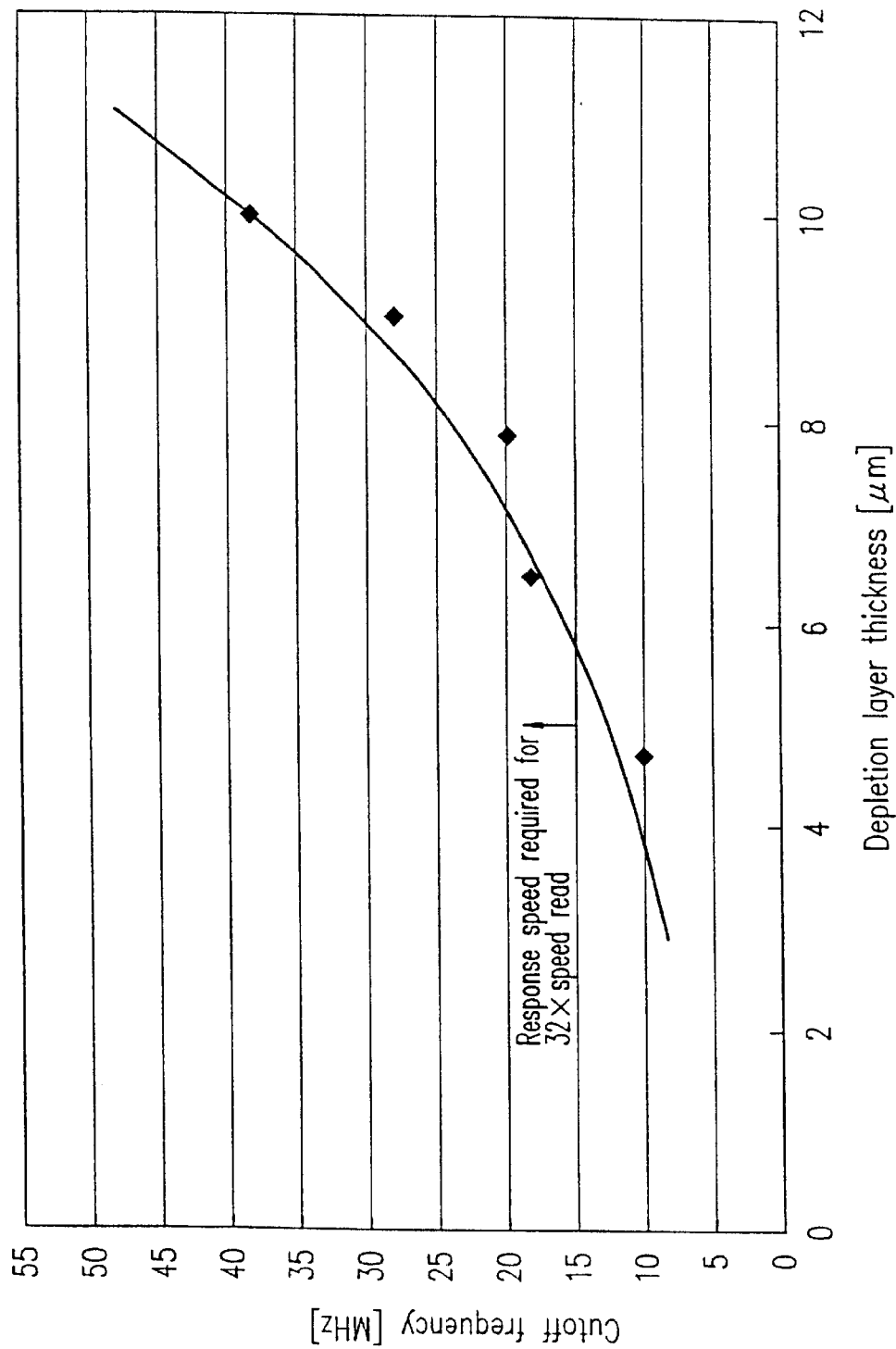
FIG. 12 is a graph illustrating the dependency of the response speed (cutoff frequency) on the depletion layer thickness with respect to the case where a small amount of light is received by the photodiode in accordance with the photosensitive device shown in FIG. 8C.

In addition to the response speed during a write operation, the response speed during a read operation is also crucial to photodiodes which support write operations. Currently, a 32× speed reading ability is a requirement. FIG. 12 shows the relationship between the depletion layer thickness and the response speed at the time of receiving a small amount of light as estimated from the experimental data shown in Table 1 above. In order to obtain a 32 times faster response speed, it is necessary that he response frequency is 23 MHz or above, which in turn requires that the frequency characteristics of the photodiode drop by 1 dB at a frequency of no less than 15 MHz. According to the graph of FIG. 12, a response speed which is necessary for the 32× speed reading ability can be realized by prescribing the depletion layer thickness at about 5 μm or above.

In order to fully satisfy the aforementioned response speed requirements for a write operation and a read operation, it is preferable that the field intensity within the depletion layer is about 0.3 V/μm or above and that the depletion layer thickness is about 5 μm or above. This in turn requires that the thickness of the P-type epitaxial layer 242 preferably be between about 13 μm and about 17 μm, and the resistivity of the P-type epitaxial layer 242 preferably be between about 100 Ωcm and 1500 Ωcm. These preferable ranges were determined based on experimental results obtained by the inventors.

Furthermore, it is preferable that the impurity concentration in the P-type semiconductor substrate 141 does not exceed a level which is equal to $10^3$ times the impurity concentration at the surface of the P-type epitaxial layer 242 in order to prevent, during the steps up to the formation of the N-type epitaxial layer, an autodope layer from being developed by the impurities which strayed out of the substrate and adhered to the surface of the P-type epitaxial layer 242 (or the constant impurity concentration layer 242b) formed on the substrate. For example, when the P-type epitaxial layer 242 is to be formed so as to have a high resistivity of about 1 kΩ, the impurity concentration in the P-type semiconductor substrate 141 is about 1 Ωcm because the impurity concentration in any autodope layer formed on the surface of the P-type epitaxial layer 242 and the impurity concentration in the P-type semiconductor substrate 141 are generally of the relationship 1:1000. Therefore, by ensuring that the impurity concentration in the P-type semiconductor substrate 141 does not exceed a level which is equal to 1000 times the prescribed impurity concentration at the surface of the P-type epitaxial layer 242, even if autodoping with the impurities does occur, the impurity concentration at the surface of the resultant P-type epitaxial layer 242 will not exceed the predetermined design value. With a view to reducing the anode resistance, the substrate resistivity is preferably as low as possible so long as the autodope does not occur. For example, if the substrate resistivity has a lower limit of about 1 Ωcm, its upper limit is preferably about 20 Ωcm or less in order to allow for stable mass production of the photosensitive device.

Furthermore, by providing an anode electrode 151 (FIG. 8C) on the bottom face of the substrate and electrically connecting the anode electrode 151 to an anode electrode 152 which is provided on the separation diffusion layer 144 on the upper surface of the photosensitive device 200, it becomes possible to further reduce the anode resistance as compared to the case where an anode electrode is provided only on the upper surface. As a result, the response speed can be further improved.

EXAMPLE 2

Figure 13A:
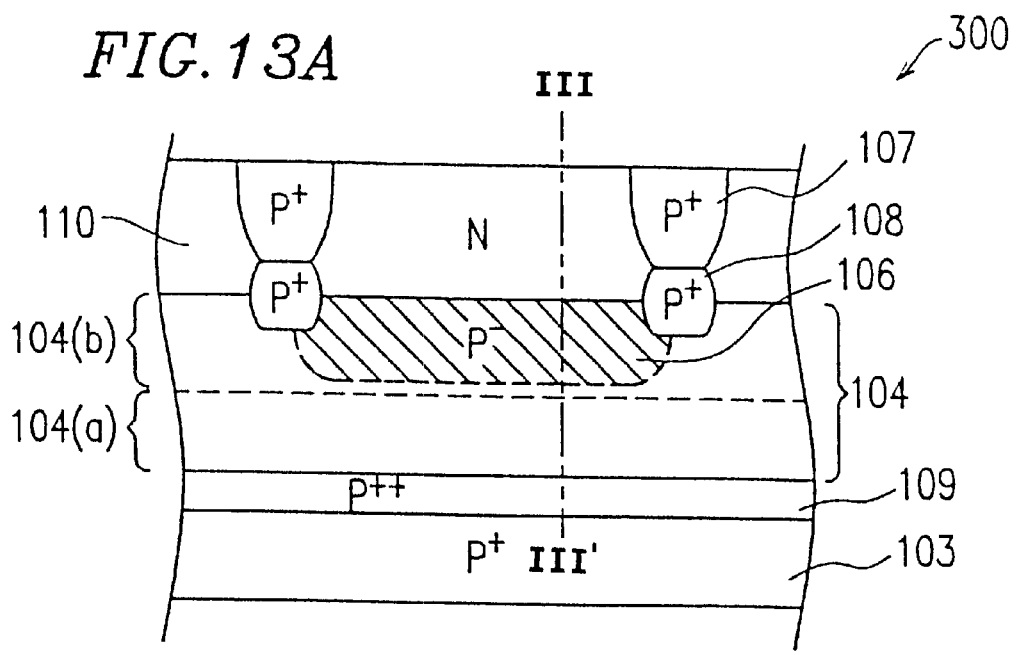
FIG. 13A is a cross-sectional view illustrating a photosensitive device according to Example 2 of the present invention.
Figure 13B:
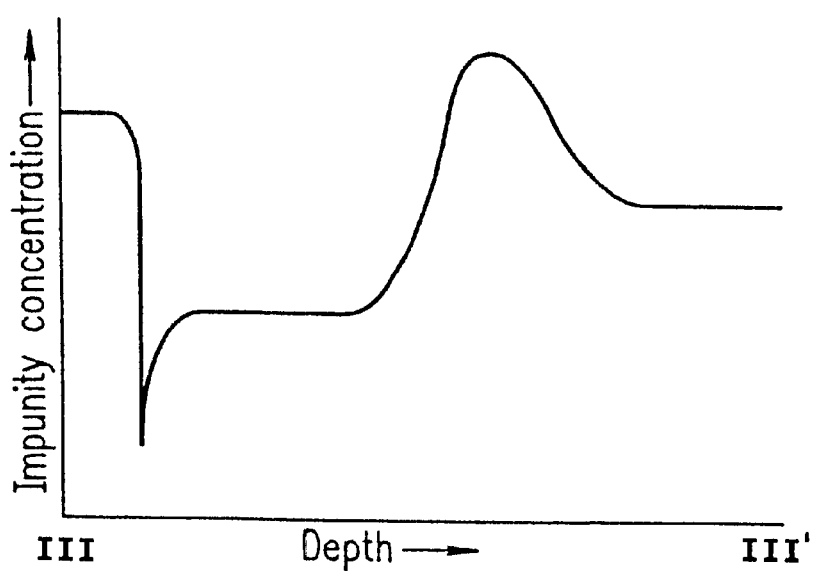
FIG. 13B is a graph showing the impurity concentration distribution along line III–III' in FIG. 13A.

FIGS. 13A and 13B are cross-sectional views illustrating the structure of a photosensitive device 300 according to Example 2 of the present invention. The anode electrode, cathode electrode, wiring, protection film, and the like are omitted from FIG. 13A.

As shown in FIG. 13A, the photosensitive device 300 has a laminate structure including a P-type embedded diffusion layer 109, a P-type epitaxial layer 104, and an N-type epitaxial layer 110 formed on a P-type semiconductor substrate 103. The N-type epitaxial layer 110 is subdivided into a plurality of regions by P-type separation diffusion layers 107 and P-type separation embedded diffusion layers 108. A junction between each subdivided region and the underlying portion of the P-type epitaxial layer 104 provides a photodiode structure. As seen from FIG. 13B, which shows an impurity profile along line III–III' in FIG. 13A, the P-type epitaxial layer 104 includes an autodope ("creep up") layer 104a and a layer 104b having a constant resistivity.

The photosensitive device 300 differs from the photosensitive device 200 according to Example 1 chiefly in that the P-type embedded diffusion layer 109 is provided between the P-type semiconductor substrate 103 and the P-type epitaxial layer 104. The photosensitive device 300 can be produced as follows: Boron is diffused over the P-type semiconductor substrate 103 so as to form the P-type embedded diffusion layer 109 thereupon, and the P-type epitaxial layer 104 is formed through crystal growth, after which the same process as the conventional process may be performed.

In accordance with the photosensitive device 200 of Example 1, only up to a 6× speed writing ability and a 32× speed reading ability can be obtained by optimizing the thickness and resistivity of the P-type epitaxial layer 242. This is because reducing the depletion layer thickness for enhancing the field intensity results in an increased capacitance component and an increased distance for the carriers (generated at relatively deep portions within the substrate) to travel over via diffusion. This not only imposes a limitation on the response speed during a read operation but also during a write operation.

Therefore, according to the present example, the P-type embedded diffusion layer 109 is formed between the P-type semiconductor substrate 103 and the P-type epitaxial layer 104 so that the P-type embedded diffusion layer 109 functions as a potential barrier against the carriers which are generated at relatively deep portions within the substrate, thereby improving the response speed of the photosensitive device 300.

Figure 14A:
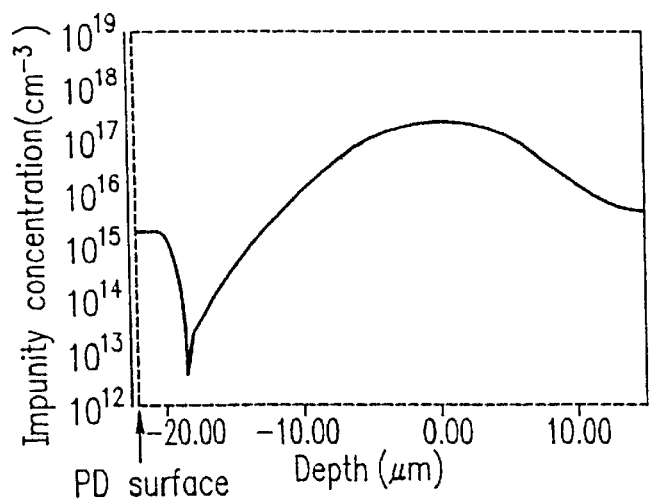
FIGS. 14A to 14C are graphs each illustrating an impurity concentration distribution along the depth direction of a photodiode used for simulation studies in accordance with the photosensitive device shown in FIGS. 13A and 13B.
Figure 14B:
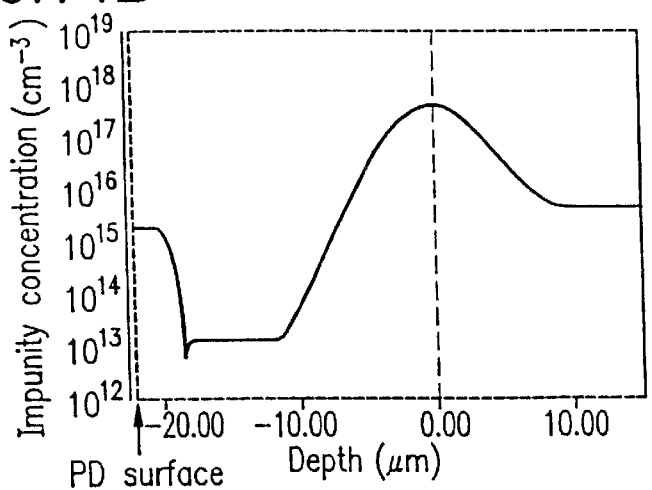
Figure 14C:
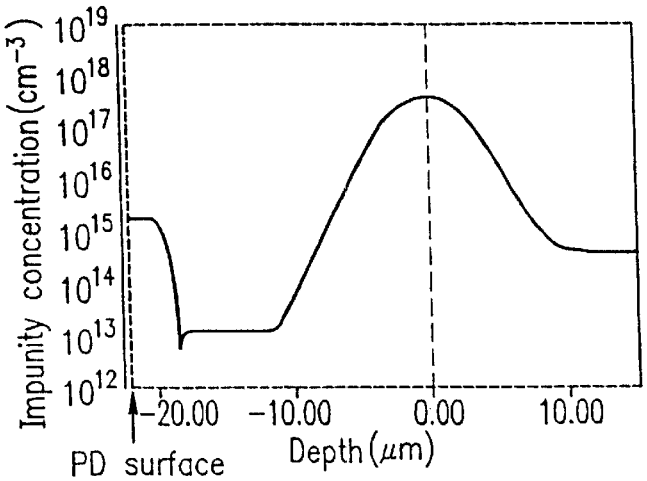

First, a device simulation was conducted to study how the P-type embedded diffusion layer 109 functions. Table 2 shows the 1% response time tf (90%→1%) (i.e., the period of time which is required for the photocurrent to decrease from 90% to 1% of its maximum value) by using pulse light (780 nm, 300 μW), with respect to three structures whose respective concentration profiles in the photodiode portions are as shown in FIGS. 14A, 14B, and 14C. In Table 2, the embedded layer thickness is defined as the distance from the position of the peak impurity concentration within the P-type embedded diffusion layer 109 to a position, located closer to its surface, at which a $10^{14}$ cm$^{-3}$ concentration exists.

TABLE 2

| Profile | Substrate resistivity [Ω cm] | Embedded layer thickness [μm] | tf(90%→1%) [ns] |
|---|---|---|---|
| a | 4 | 16 | 28 |
| b | 4 | 8 | 15 |
| c | 40 | 8 | 7.9 |

As used herein, the 1% response time is determined by the carriers which migrate from within the substrate via diffusion. Between the structures having the concentration profiles shown in FIGS. 14A and 14B, only the thickness of the P-type embedded diffusion layer 109 is varied while maintaining the impurity concentration in the P-type semiconductor substrate 103, the P-type embedded diffusion layer 109, and the P-type epitaxial layer 104 at the same levels.

Between the structures having the concentration profile shown in FIGS. 14A and 14B, the structure having the profile shown in FIG. 14B provides a greatly improved response speed. Thus, it can be seen that the response speed improvement effects cannot be obtained in the case where the P-type embedded diffusion layer 109 has such a large thickness that the potential barrier created by the P-type embedded diffusion layer 109 does not have a large gradient.

Between the structures having the concentration profiles shown in FIGS. 14B and 14C, only the impurity concentration (resistivity) in the P-type semiconductor substrate 103 is varied, while conserving the remainder of the concentration profiles. From FIGS. 14B and 14C, it can be seen that the response speed greatly changes depending on the concentration in the P-type semiconductor substrate 103.

Figure 15A:
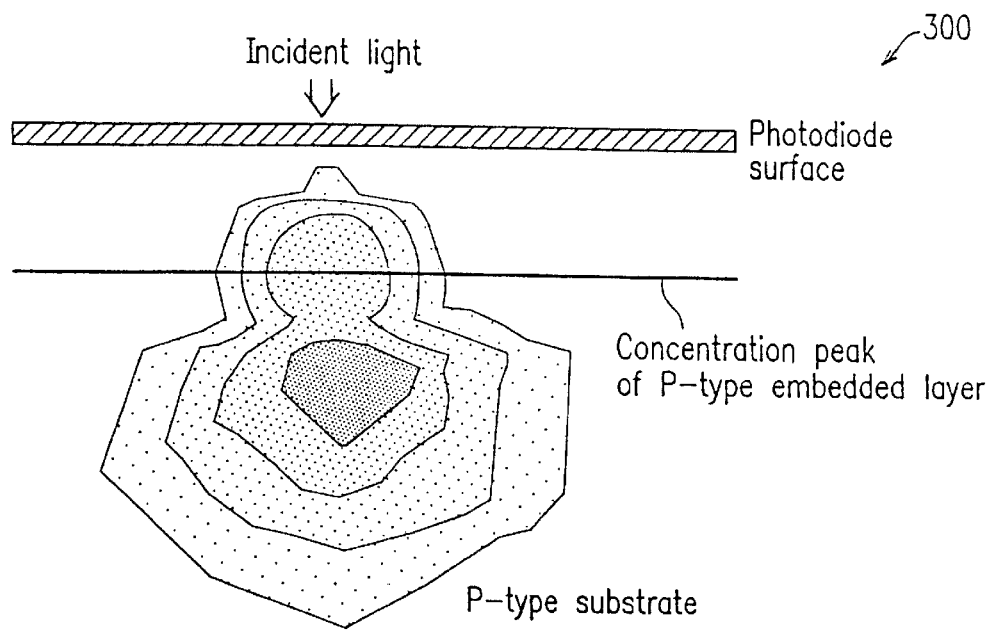
FIG. 15A shows a plane distribution of carriers, taken at 2 nsec after a pulse light irradiation (pulse width: 10 µsec) is performed, in a photodiode having the impurity concentration profile shown in FIG. 14C.
Figure 15B:
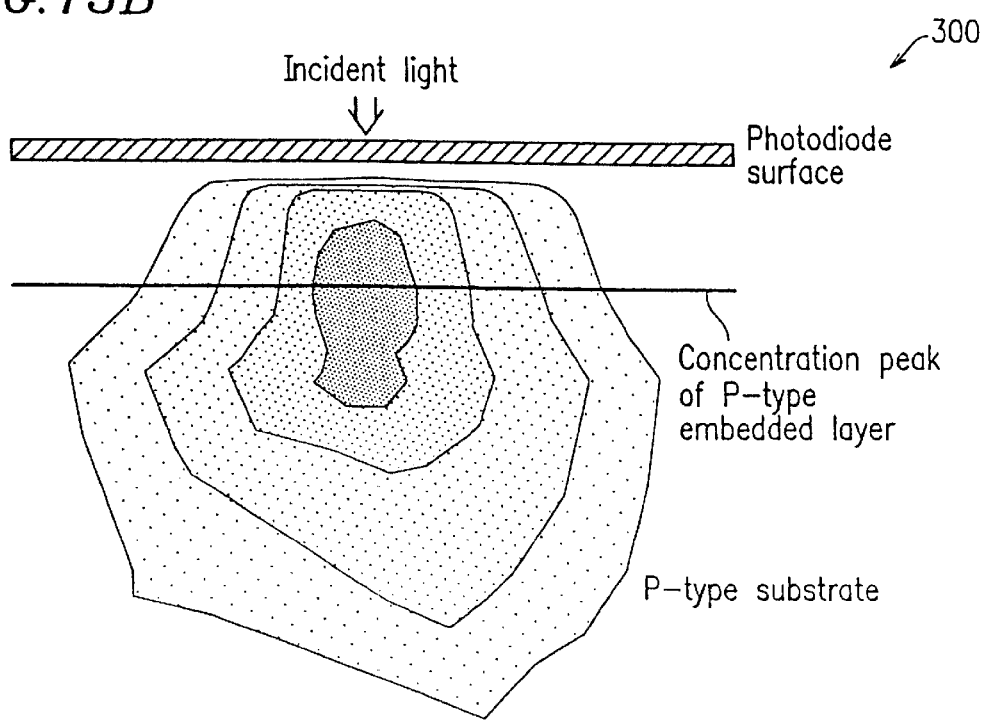
FIG. 15B shows a plane distribution of carriers, taken at 2 nsec after a pulse light irradiation (pulse width: 10 µsec) is performed, in a photodiode having the impurity concentration profile shown in FIG. 14B.

FIG. 15A shows an electron concentration distribution taken at 2 nsec after a pulse light irradiation (pulse width: 10 μsec) is performed for the structure having the concentration profile shown in FIG. 14C. FIG. 15B shows an electron concentration distribution taken at 2 nsec after a pulse light irradiation (pulse width: 10 μsec) is performed for the structure having the concentration profile shown in FIG. 14B. FIGS. 15A and 15B each illustrate a cross section of the photodiode portion, in which electrons are depicted as dots; an area with dots at a higher density represents a higher electron concentration. The solid line in each of FIGS. 15A and 15B represents a concentration peak in the P-type embedded diffusion layer 109. The higher electron concentration in the vicinity of the entire surface is ascribable to the provision of an N-type high concentration implantation layer for reducing the cathode resistance.

As seen from FIG. 15A illustrating the structure having the concentration profile shown in FIG. 14C, in which the substrate has a high resistivity and the potential barrier has a sufficient height, the carriers in positions deeper than the P-type embedded diffusion layer 109 cannot override the barrier, resulting in a carrier accumulation. On the other hand, as seen from FIG. 15B illustrating the structure having the concentration profile shown in FIG. 14B, in which the potential barrier does not have a sufficient height, the carriers flow out toward the surface so as to be distributed in the neighborhood of the peak concentration in the P-type embedded diffusion layer 109. Thus, the decreased response speed of the structure having the concentration profile shown in FIG. 14B is ascribable to the fact that carriers generated on the substrate side of the P-type embedded diffusion layer 109 override the potential barrier to act as a slow current component.

Thus, in a photosensitive device incorporating the P-type embedded diffusion layer 109 shown in FIG. 13, the P-type embedded diffusion layer 109 serves as a potential barrier against the carriers generated on the substrate side of the P-type embedded diffusion layer 109. As a result, the carriers generated on the substrate side of the P-type embedded diffusion layer 109 are prevented from overriding the potential barrier to migrate toward the surface, and will disappear through recombination within the substrate. Moreover, the carriers generated in a region ranging from the peak concentration portion in the P-type embedded diffusion layer 109 to the depletion layer 106 are accelerated by an internal field created by the large concentration gradient due to the P-type embedded diffusion layer 109, and therefore migrate over to the end of the depletion layer 106 faster than they would via diffusion. Thus, both the response speed during a write operation and the response speed during a read operation of a photodiode which supports write operations can be improved. This response speed improvement effect can be further enhanced by the P-type embedded diffusion layer 109 presenting a sufficient concentration difference and a gradient with respect to the P-type semiconductor substrate 103.

Next, the inventors conducted a simulation with respect to a profile obtained by varying the thickness of the depletion layer 106 by varying the thickness of the P-type epitaxial layer 104. Table 3 shows the response time tf (90%→10%) (i.e., the period of time which is required for the photocurrent to decrease from 90% to 10% of its maximum value) by using 350 μW light irradiation, with respect to a structure whose concentration profile in the photodiode portion is as shown in FIG. 14B, where the thickness of the P-type high resistance epitaxial layer 104 is varied.

TABLE 3

| P-type high resistance epitaxial layer thickness [μm] | Depletion layer thickness [μm] | Field intensity within depletion layer [V/μm] | Large amount of light (350 μW) tf(90%→10%) [ns] |
|---|---|---|---|
| 13 | 3 | 0.70 | 1.8 |
| 15 | 5 | 0.42 | 1.9 |
| 17 | 7 | 0.30 | 2.9 |
| 20 | 10 | 0.21 | 6.4 |
| Required ability (12 × speed write) | | | 4 or below |

Figure 16A:
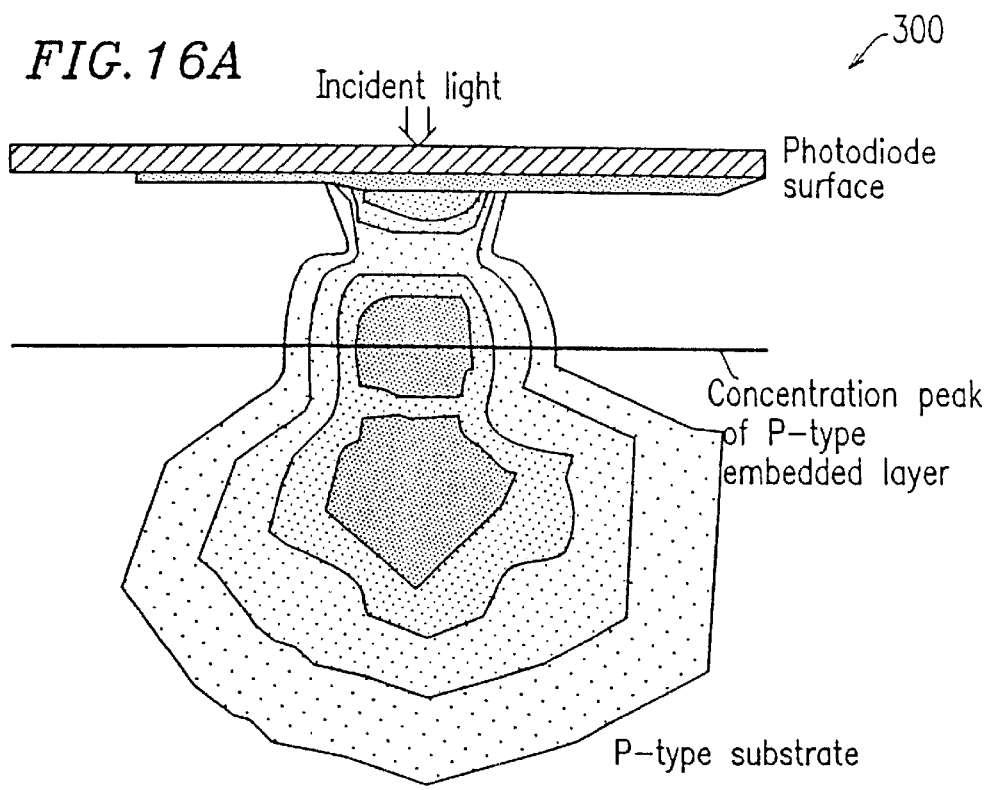
FIG. 16A shows a plane distribution of carriers, taken at the time of pulse light irradiation (pulse width: 10 µsec), in a photodiode whose P-type epitaxial layer has a thickness of 15 µm.
Figure 16B:
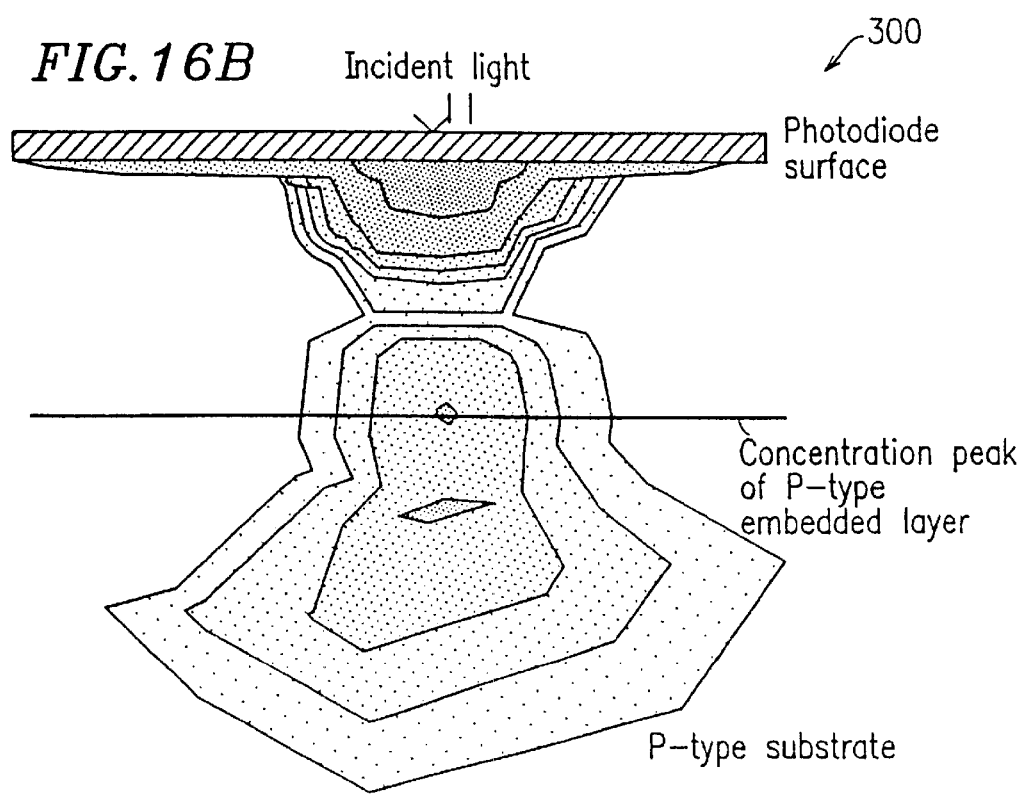
FIG. 16B shows a plane distribution of carriers, taken at the time of pulse light irradiation (pulse width: 10 µsec), in a photodiode whose P-type epitaxial layer has a thickness of 20 µm.

FIG. 16A shows an electron concentration distribution in the photodiode portion of a structure whose P-type epitaxial layer 104 has a thickness of 15 μm and which has a field intensity of 0.42 V/μm within the depletion layer 106 taken at the time of pulse light irradiation (pulse width: 10 μsec) is performed. FIG. 16B shows an electron concentration distribution in the photodiode portion of a structure whose P-type epitaxial layer 104 has a thickness of 20 μm and which has a field intensity of 0.21 V/μm within the depletion layer 106 taken at the time of pulse light irradiation (pulse width: 10 μsec) is performed. FIGS. 16A and 16B each illustrate a cross section of the photodiode portion, in which electrons are depicted as dots; an area with dots at a higher density represents a higher electron concentration. The solid line in each of FIGS. 16A and 16B represents a concentration peak in the P-type embedded diffusion layer 109. The higher electron concentration in the vicinity of the entire surface is ascribable to the provision of an N-type high concentration implantation layer for reducing the cathode resistance.

As seen from FIG. 16B illustrating the structure whose P-type epitaxial layer 104 is 20 μm thick, carriers are accumulated in the vicinity of the depletion layer 106. Thus, the depletion layer becomes more spread and the field intensity within the depletion is decreased as the thickness of the P-type epitaxial layer increases, thereby resulting in charge accumulation and a lower response speed.

Figure 17:
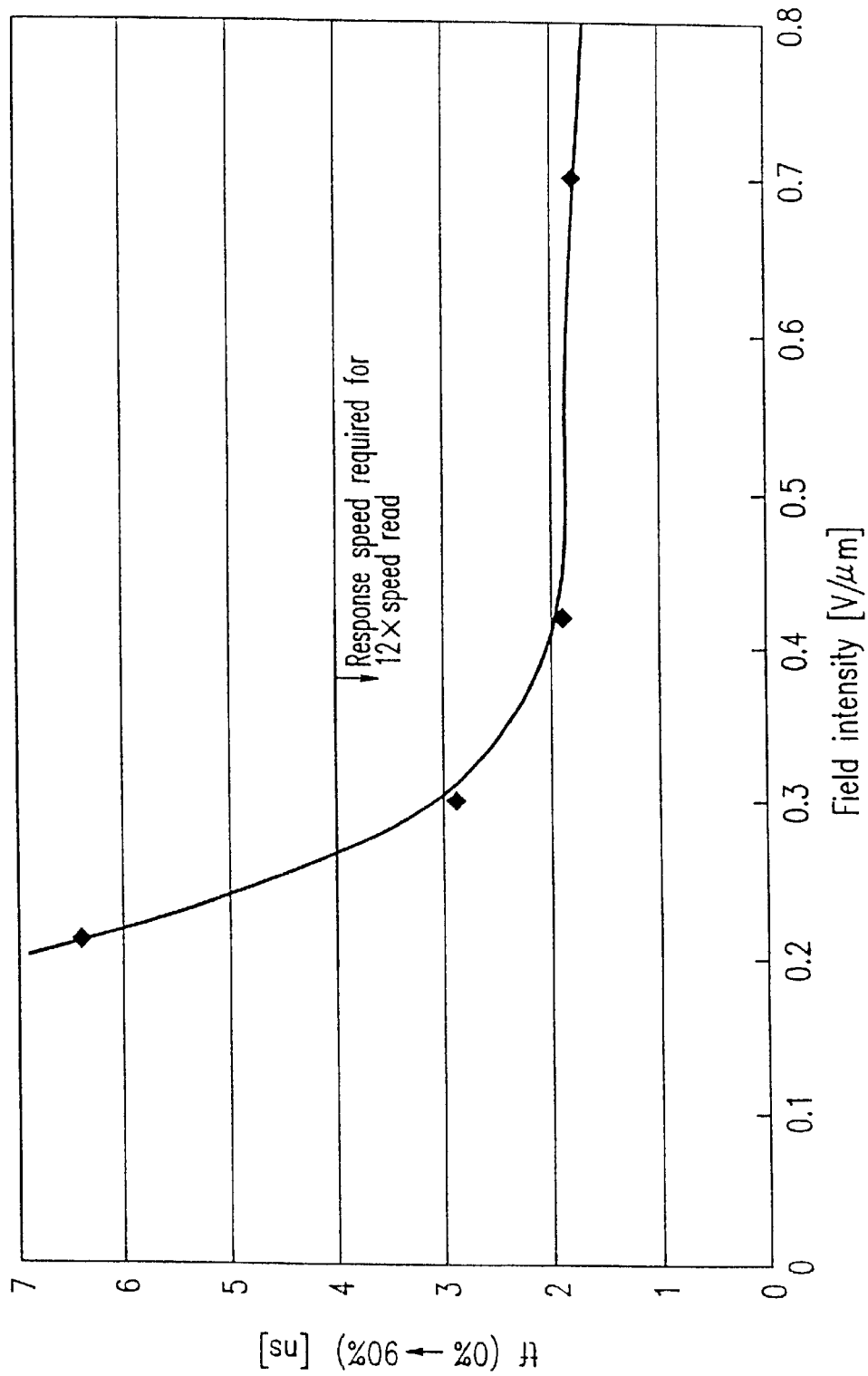
FIG. 17 is a graph illustrating simulation results on the field intensity within the depletion layer and the response speed of a photodiode in accordance with the photosensitive device shown in FIGS. 13A and 13B, where a large amount of light is received.

FIG. 17 shows the relationship between the field intensity within the depletion layer 106 and the 10% response time tf (0%→90%) (i.e., the period of time which is required for the cathode current to decrease to 10% of its maximum value) by using pulse light (780 nm, 300 µW). As seen from FIG. 17, by prescribing the thickness and resistivity of the P-type epitaxial layer 104 so as to satisfy the equation below, a 12× speed writing ability (tf≦4 ns), which will be a requirement for next-generation photodiodes which support write operations:

$$Ed'>0.3 \text{ V}/\mu m$$

where Ed' represents an average field intensity that is generated within the depletion layer 106 when an operation reverse bias voltage is applied to the photosensitive device 300. The reasons for prescribing the thickness and resistivity of the P-type epitaxial layer 104 in the above manner are as follows. By increasing the field intensity within the depletion layer, the force to drive photocarriers existing in the vicinity of the junction is increased so as to minimize the decrease in the response speed due to carrier accumulation at the time when the photosensitive device 300 receives a large amount of light.

In order to obtain a field intensity of about 0.3 V/µcm or above within the depletion layer so as to attain the aforementioned writing abilities while minimizing the increase in the capacitance of the photodiode, it is preferable that the P-type epitaxial layer 104 has a thickness which is between about 9 µm and about 17 µm and a resistivity which is between about 100 Ωcm and about 1500 Ωcm. The preferred range of thickness of the P-type epitaxial layer 104 was determined from the simulation data shown in Table 3, and the preferred range of resistivity of the P-type epitaxial layer 104 was determined from results of simulations conducted by the inventors. The preferred lower limit of the thickness of the P-type epitaxial layer 104 is set at about 9 µm because, as seen from FIG. 14B, the concentration of the junction portion between the N-type epitaxial layer 110 and the P-type epitaxial layer 104 would increase due to the influence of the autodope layer 104a as the thickness of the P-type epitaxial layer 104 becomes smaller than about 9 µm, thereby resulting in an increased junction capacitance and a lower response speed.

Furthermore, in order to allow the P-type embedded diffusion layer 109 according to the present example to fully function as a potential barrier, it is preferable that the peak impurity concentration in the P-type embedded diffusion layer 109 is equal to or greater than about 100 times the impurity concentration in the P-type semiconductor substrate 103 for the following reasons.

In the case where the P-type embedded diffusion layer 109 does not have a sufficiently high diffusion potential relative to the P-type semiconductor substrate 103, the carriers which are generated on the substrate side of the P-type embedded diffusion layer 109 override the P-type embedded diffusion layer 109 due to thermal energy and reach the PN junction, thereby causing a decrease in the response speed. The thermal energy in the operation temperature range, i.e., about 10° C. to about 100° C. is in the range from about 0.03 eV to about 0.04 eV. Therefore, it is necessary to provide a sufficiently high diffusion potential to defeat such thermal energy. In order to ensure that 10% or less carriers may override the P-type embedded diffusion layer 109 so as to prevent the carries generated in the substrate 103 from flowing toward the surface of the photosensitive device 300, it is necessary for the P-type embedded diffusion layer 109 to have a potential of about 0.1 V or above with respect to the P-type semiconductor substrate 103. This is because the probability p for electrons having a thermal energy of Ee (eV) to override a potential barrier of Eb (eV) is:

$$p=\text{Exp}(-Eb/Ee),$$

so that:

$$p=\text{Exp}(-Eb/0.04)<0.1$$

$$Eb>-0.04\times\log(0.1)=0.1.$$

Figure 18:
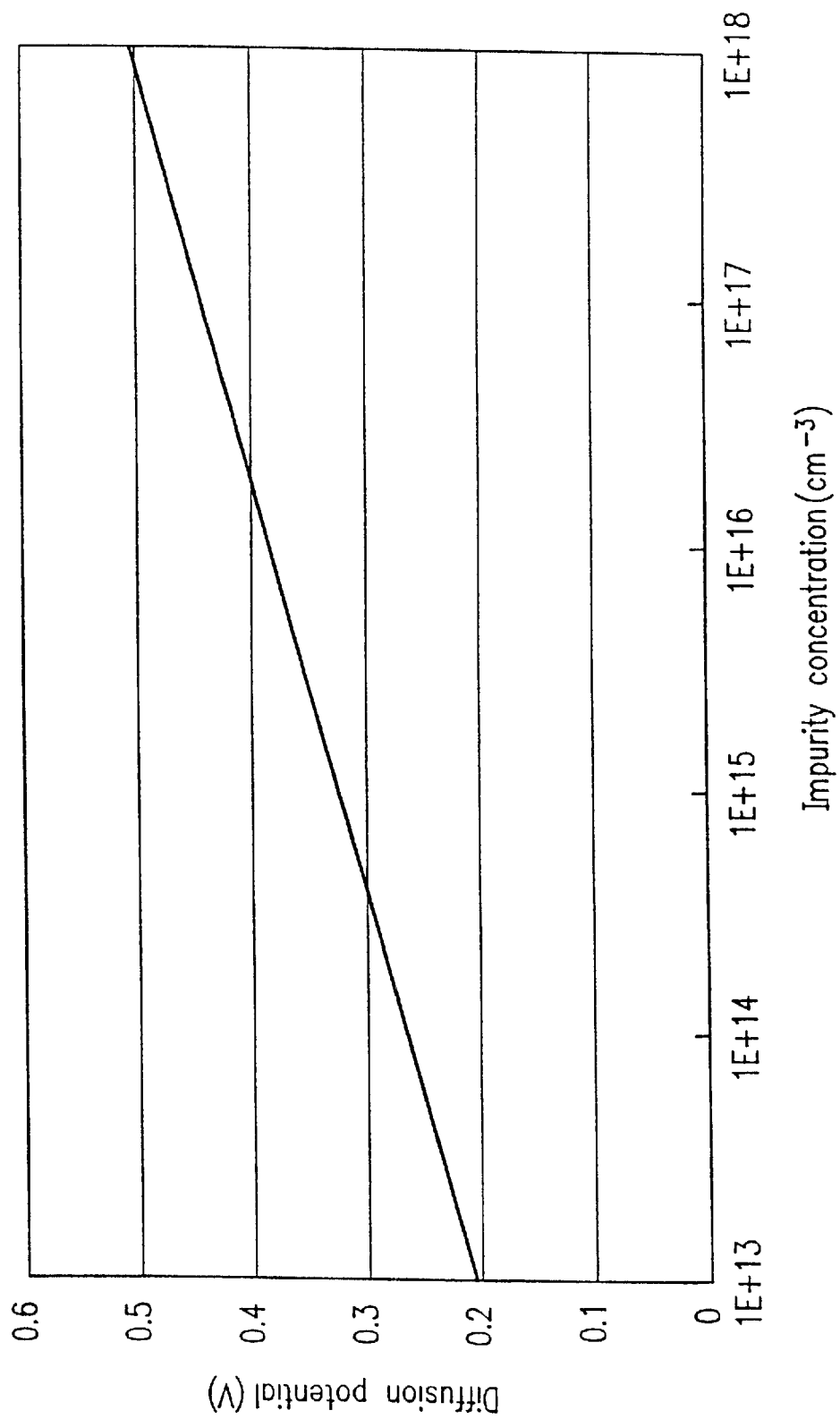
FIG. 18 is a graph illustrating the relationship between the diffusion potential generated due to an impurity concentration gradient and impurity concentration.

Now, the relationship between the impurity concentration and the diffusion potential is illustrated in FIG. 18. As seen from FIG. 18, in order to secure a potential difference of about 0.1 V or more between the P-type embedded diffusion layer 109 and the P-type semiconductor substrate 103, it is necessary to prescribe the peak impurity concentration in the P-type embedded diffusion layer 109 at equal to or greater than 100 times the impurity concentration in the P-type semiconductor substrate 103. In other words, by prescribing the peak impurity concentration in the P-type embedded diffusion layer 109 at equal to or greater than 100 times the impurity concentration in the P-type semiconductor substrate 103, it is possible to improve the decrease in the response speed due to carriers generated on the substrate side of the P-type embedded diffusion layer 109.

Furthermore, the P-type embedded diffusion layer 109 serves more effectively as a potential barrier as the difference in peak impurity concentration between the P-type semiconductor substrate 103 and the P-type embedded diffusion layer 109 becomes larger. A substrate which is produced by a FZ (Float Zone) technique is more advantageous for decreasing the impurity concentration in the substrate, but may result in poor mechanical strength of the wafer, leading to defective products and hence a reduced yield. A substrate which is produced by a CZ (Czochralski) technique is preferable because it precludes the problem of defective products and reduced yield. Since the highest possible substrate resistivity that is achievable with the CZ technique is about 50 Ωcm, it is preferable to employ a CZ substrate having a resistivity of about 20 Ωcm to about 50 Ωcm. For, assuming that an upper limit of the resistivity about 50 Ωcm, a lower limit of about 20 Ωcm would be required for ensuring a stable mass production of the photosensitive device.

In order to provide a sufficiently high impurity concentration (100 times or greater) with respect to the P-type semiconductor substrate 103, it is preferable that the peak impurity concentration in the P-type embedded diffusion layer 109 is about $1\times10^{17}$ $cm^{-3}$ or more.

It is advantageous to form the P-type embedded diffusion layer 109 by ion implantation in terms of controllability of the film thickness and resistivity. However, the production yield may decrease due to defective products if ions are implanted at a high concentration of about $1\times10^{17}$ $cm^{-3}$ or more. In order to prevent a decrease in the production yield due to such defects, it is preferable that the P-type embedded diffusion layer 109 is formed by being applied and then diffused.

In order to improve the 1% response time with respect to pulse light, it is preferable to prescribe the concentration profile of the P-type embedded diffusion layer 109 as follows:

$$Xu<38 \text{ }\mu m$$

where Xu represents the thickness as taken from the surface of the photodiode to a position at which an about 1/100 concentration level of the peak impurity concentration in the P-type embedded diffusion layer 109 exists on the substrate side of the P-type embedded diffusion layer 109. Such a concentration profile is preferable because, only if a potential barrier is formed in a portion shallower than a point where the incident light has been absorbed down to an intensity level of about 1% or less, can carriers with slow response be sufficiently eliminated so that a sufficient response speed improving effect cannot be obtained. Now, when light having a wavelength of 780 nm (which is employed for CD-ROM applications) is incident on Si, the light will have been attenuated to an intensity level of about 1% or less at a depth of about 38 $\mu$m. Therefore, it is preferable to prescribe the thickness Xu, which defines the thickness from the surface of the photodiode to a position at which an about 1/100 concentration level of the peak impurity concentration in the P-type embedded diffusion layer 109 exists on the substrate side of the P-type embedded diffusion layer 109, at about 38 $\mu$m or less.

In a manner similar to employing the photosensitive device 200 according to Example 1 of the present invention shown in FIG. 8C, a photosensitive device having internal circuitry can be obtained by employing the photosensitive device 300 according to Example 2 of the present invention such that signal processing circuitry is formed in an N-type epitaxial layer region separated from the photodiode portion by P-type separation diffusion layers 107 and P-type separation embedded diffusion layers 108 that are provided on the same substrate. As a result, the overall pickup system can be downsized, and the production cost thereof can be reduced.

Figure 19:
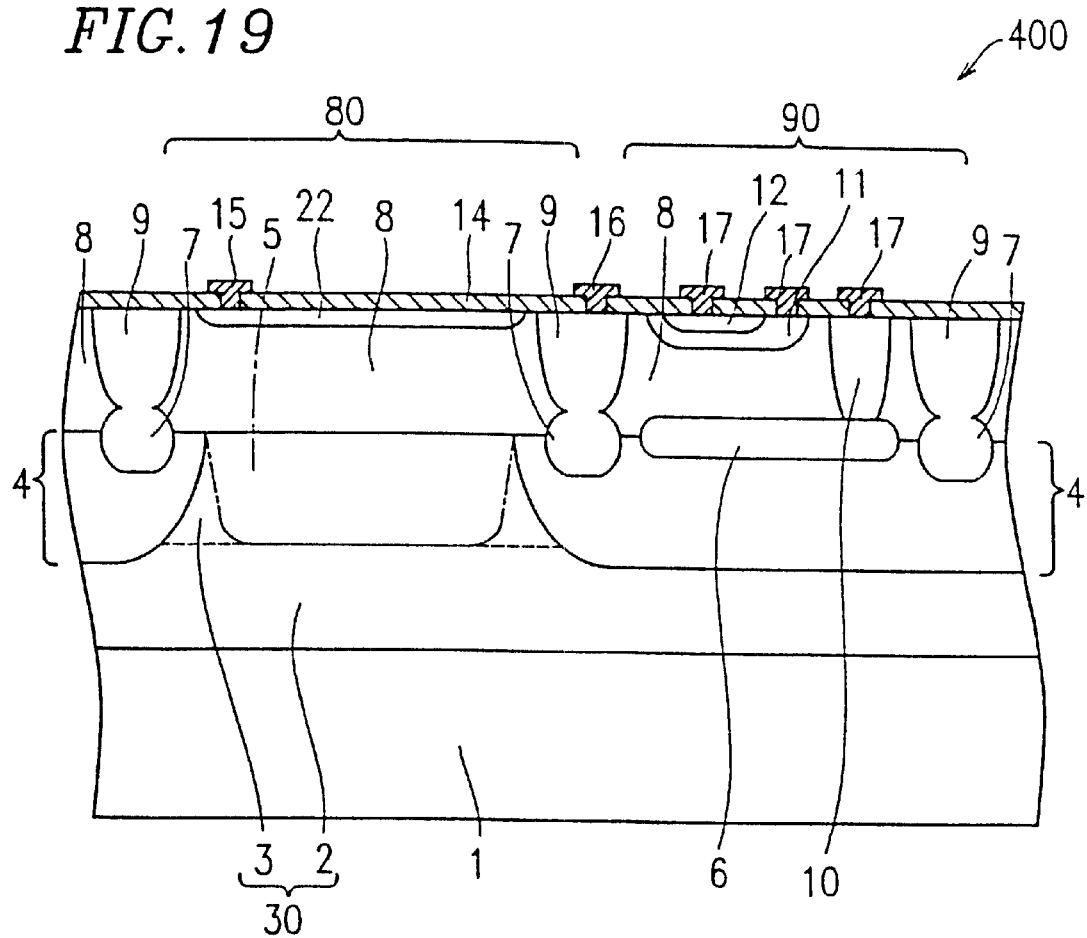
FIG. 19 is a cross-sectional view illustrating the structure of a photosensitive device having internal circuitry according to one embodiment of the invention.

FIG. 19 shows a photosensitive device 400 according to one embodiment of the present invention.

The photosensitive device 400 shown in FIG. 19 includes a P-type semiconductor substrate 1, a P-type high resistance epitaxial layer 30, a P-type high concentration embedded diffusion layer 4, P-type separation embedded diffusion layers 7, a depletion layer 5, an N-type collector region 6, N-type epitaxial layers 8, P-type separation diffusion layers 9, an N-type collector contact region 10, a P-type base region 11, an N-type emitter region 12, a cover film 14, a cathode contact 15, an anode contact 16, transistor contacts 17, a cathode contact region 22, a photodiode structural portion 80, and a circuitry structural portion 90. The P-type high resistance epitaxial layer 30 includes a constant resistivity layer 2 and an autodope layer 3.

In a photosensitive device having internal circuitry, as in the case of the photosensitive device 400 in FIG. 19, it is preferable to form the P-type high concentration embedded diffusion layer 4 beginning from the surface of the P-type epitaxial layer 30. As a result, the anode resistance can be reduced by decreasing the resistance below the P-type separation embedded diffusion layer 7, thereby further enhancing the response speed of the photodiode. It is also possible to prevent a latch-up phenomenon by reducing the substrate resistance in the circuitry portion.

In the photosensitive device 200 or 300 shown in FIG. 8C or 13A, too, it is preferable to form the aforementioned P-type high concentration embedded diffusion layer beginning from the surface of the P-type epitaxial layer 242 or the P-type embedded diffusion layer 109, respectively.

Although the aforementioned examples illustrate the P-type as the first conductivity type and N-type as the second conductivity type, it will be appreciated that the N-type may be employed as the first conductivity type and the P-type as the second conductivity type.

Although it is preferable to form a plurality of photodiode portions in the photosensitive device according to the present invention, the present invention is also applicable to embodiments where only one photodiode portion is provided.

As described above, according to the present invention, a laminate substrate is employed which includes a semiconductor substrate of a first conductivity type and a semiconductor layer of the first conductivity type formed thereon and having a lower impurity concentration than that of the semiconductor substrate is employed so as to form a photodiode thereon. The depletion layer thickness is reduced by adjusting the thickness and resistivity of the semiconductor layer of the first conductivity type, whereby the field intensity within the depletion layer can be enhanced without changing the bias voltage applied to the photodiode. As a result, enhanced force to drive carriers in the vicinity of the junction due to an electric field is provided, whereby the decrease in the response speed due to carrier accumulation at the time of receiving a large amount of light can be prevented.

However, a smaller depletion layer thickness leads to an increased capacitance component and a longer distance being traveled via diffusion by the carriers which are generated below the depletion layer, thereby resulting in a decrease in the response speed at the time of receiving a small amount of light. Therefore, in order to satisfy both the response speed requirement for a small amount of light during a read operation and the response speed requirement for a large amount of light during a write operation, the thickness and resistivity of the semiconductor layer of the first conductivity type are adjusted so as to realize desired device specifications.

Moreover, according to the present invention, a first semiconductor layer of the first conductivity type having a relatively high impurity concentration is provided between a semiconductor substrate of a first conductivity type and a second semiconductor layer of the first conductivity type whose impurity concentration is lower than that of the semiconductor substrate. Thus, the first semiconductor layer of the first conductivity type can serve as a potential barrier against the carriers which are generated on the substrate side thereof, thereby eliminating a slow current component which travels a long distance via diffusion. Since the carriers which are generated in a portion closer to the surface than a peak impurity concentration portion of the first semiconductor layer of the first conductivity type are accelerated by an internal field within the first semiconductor layer of the first conductivity type, they migrate over to the end of the depletion layer faster than they would via diffusion. As a result, the response speed can be further improved.

As described above, according to the present invention, there is provided a photosensitive device which supports write operations, as well as a photosensitive device having internal circuitry, such that the decrease in the response speed due to carrier accumulation at the time of receiving a large amount of light during a write operation is prevented, whereby both the response speed when receiving a small amount of light during a read operation and the response speed when receiving a large amount of light during a write operation can be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A photosensitive device comprising:
a semiconductor substrate of a first conductivity type:
a semiconductor layer of the first conductivity type formed on the semiconductor substrate and having a lower impurity concentration than that of the semiconductor substrate;
a semiconductor layer of a second conductivity type formed on the semiconductor layer of the first conductivity type; and
at least one diffusion layer of the first conductivity type formed from the surface of the semiconductor layer of the second conductivity type so as to reach the surface of the semiconductor layer of the first conductivity type, the at least one diffusion layer subdividing the semiconductor layer of the second conductivity type into a plurality of semiconductor regions of the second conductivity type,
wherein at least one photodiode portion for converting signal light into an electrical signal is formed at a junction between at least one of the plurality of semiconductor regions of the second conductivity type and the semiconductor layer of the first conductivity type, and
wherein a depletion layer which is formed in the semiconductor layer of the first conductivity type when a reverse bias voltage is applied to the at least one photodiode portion has a field intensity of about 0.3 V/$\mu$m or more.

2. A photosensitive device according to claim 1, wherein the depletion layer formed in the semiconductor layer of the first conductivity type has a thickness of 5 $\mu$m or more.

3. A photosensitive device according to claim 1, wherein the semiconductor layer of the first conductivity type has a thickness of about 13 $\mu$m to about 17 $\mu$m and a resistivity of about 100 $\Omega$cm to about 1500 $\Omega$cm.

4. A photosensitive device according to claim 1, wherein the semiconductor substrate has a resistivity of about 1 $\Omega$cm to about 20 $\Omega$cm.

5. A photosensitive device according to claim 1, further comprising:
a first electrode provided on a back face of the semiconductor substrate;
a second electrode provided on the surface of the semiconductor layer of the second conductivity type,
wherein the first and second electrodes are electrically coupled to each other.

6. A photosensitive device according to claim 1,
wherein the plurality of semiconductor regions of the second conductivity type comprise at least one first region defining the at least one photodiode portion and at least one second region discrete from the at least one first region, and
wherein a signal processing circuitry portion for processing the electrical signal is provided in the at least one second region.

7. A photosensitive device according to claim 6, further comprising a high concentration diffusion layer of the first conductivity type formed at an interface between the at least one second region and the first semiconductor layer of the first conductivity type.

8. A photosensitive device comprising:
a semiconductor substrate of a first conductivity type having a high impurity concentration;
a first semiconductor layer of the first conductivity type formed on the semiconductor substrate having the high impurity concentration and having a higher impurity concentration than that of the semiconductor substrate having the high impurity concentration;
a second semiconductor layer of the first conductivity type formed on the first semiconductor layer of the first conductivity type and having a lower impurity concentration than that of the semiconductor substrate;
a semiconductor layer of a second conductivity type formed on the second semiconductor layer of the first conductivity type; and
at least one diffusion layer of the first conductivity type formed from the surface of the semiconductor layer of the second conductivity type so as to reach the surface of the second semiconductor layer of the first conductivity type, the at least one diffusion layer subdividing the semiconductor layer of the second conductivity type into a plurality of semiconductor regions of the second conductivity type,
wherein at least one photodiode portion for converting signal light into an electrical signal is formed at a junction between at least one of the plurality of semiconductor regions of the second conductivity type and the second semiconductor layer of the first conductivity type, the first semiconductor layer of the first conductivity type has a region of an increasing impurity concentration from the semiconductor substrate toward the surface of the semiconductor layer of the second conductivity type, and a portion having about 1/100 of the highest impurity concentration throughout the first semiconductor layer of the first conductivity type exists at a depth of about 38 $\mu$m or less from the surface of the semiconductor layer of the second conductivity type, and
wherein a depletion layer which is formed in the second semiconductor layer of the first conductivity type when a reverse bias voltage is applied to the at least one photodiode portion has a field intensity of about 0.3 V/$\mu$m or more.

9. A photosensitive device according to claim 8, wherein the second semiconductor layer of the first conductivity type has a thickness of about 9 $\mu$m to about 17 $\mu$m and a resistivity of about 100 $\Omega$cm to about 1500 $\Omega$cm.

10. A photosensitive device according to claim 8, wherein the semiconductor substrate has an impurity concentration equal to or smaller than about 1/100 of a peak impurity concentration in the first semiconductor layer of the first conductivity type.

11. A photosensitive device according to claim 8, wherein the semiconductor substrate is produced by a CZ method and has a resistivity of about 20 $\Omega$cm to about 50 $\Omega$cm.

12. A photosensitive device according to claim 10, wherein the first semiconductor layer of the first conductivity type has a peak impurity concentration of about 1×10$^{17}$ cm$^{-3}$ or more.

13. A photosensitive device according to claim 11, wherein the first semiconductor layer of the first conductivity type has a peak impurity concentration of about 1×10$^{17}$ cm$^{-3}$ or more.

14. A photosensitive device according to claim 8, wherein the first semiconductor layer of the first conductivity type is formed by being applied and diffused.

15. A photosensitive device according to claim 10, wherein the first semiconductor layer of the first conductivity type has a region of an increasing impurity concentration from the semiconductor substrate toward the surface of the semiconductor layer of the second conductivity type, and wherein a portion having about 1/100 of the highest impurity concentration throughout the first semiconductor layer of the first conductivity type exists at a depth of about 38 $\mu$m or less from the surface of the semiconductor layer of the second conductivity type.

16. A photosensitive device according to claim 11, wherein the first semiconductor layer of the first conductivity type has a region of an increasing impurity concentration from the semiconductor substrate toward the surface of the semiconductor layer of the second conductivity type, and wherein a portion having about 1/100 of the highest impurity concentration throughout the first semiconductor layer of the first conductivity type exists at a depth of about 38 $\mu$m or less from the surface of the semiconductor layer of the second conductivity type.

17. A photosensitive device according to claim 14, wherein the first semiconductor layer of the first conductivity type has a region of an increasing impurity concentration from the semiconductor substrate toward the surface of the semiconductor layer of the second conductivity type, and wherein a portion having about 1/100 of the highest impurity concentration throughout the first semiconductor layer of the first conductivity type exists at a depth of about 38 $\mu$m or less from the surface of the semiconductor layer of the second conductivity type.

18. A photosensitive device according to claim 8,
wherein the plurality of semiconductor regions of the second conductivity type comprise at least one first region defining the at least one photodiode portion and at least one second region discrete from the at least one first region, and
wherein a signal processing circuitry portion for processing the electrical signal is provided in the at least one second region.

19. A photosensitive device according to claim 18, further comprising a high concentration diffusion layer of the first conductivity type formed at an interface between the at least one second region and the second semiconductor layer of the first conductivity type.

20. A photosensitive device comprising:
a semiconductor layer of the first conductivity type formed on the semiconductor substrate and having a lower impurity concentration than that of the semiconductor substrate, the impurity concentration of the semiconductor substrate not exceeding a level which is equal to $10^3$ times the impurity concentration at the surface of the semiconductor layer of the first conductivity type;
a semiconductor layer of a second conductivity type formed on the semiconductor layer of the first conductivity type; and
at least one diffusion layer of the first conductivity type formed from the surface of the semiconductor layer of the second conductivity type so as to reach the surface of the semiconductor layer of the first conductivity type, the at least one diffusion layer subdividing into a plurality of semiconductor regions of the second conductivity type,
wherein at least one photodiode portion for converting signal light into an electrical signal is formed at a junction between at least one of the plurality of semiconductor regions of the second conductivity type and the semiconductor layer of the first conductivity type, and
wherein a depletion layer which is formed in the semiconductor layer of the first conductivity type when a reverse bias voltage is applied to the at least one photodiode portion has a field intensity of about 0.3 V/$\mu$m or more.

21. A photosensitive device comprising:
a semiconductor substrate of a first conductivity type having a high impurity concentration;
a first semiconductor layer of the first conductivity type formed on the semiconductor substrate having the high impurity concentration and having a higher impurity concentration than that of the semiconductor substrate having the high impurity concentration, the impurity concentration of the first semiconductor layer of the first conductivity type being more than 100 times greater than the impurity concentration of the semiconductor substrate of the first conductivity type;
a second semiconductor layer of the first conductivity type formed on the first semiconductor layer of the first conductivity type and having a lower impurity concentration than that of the semiconductor substrate;
a semiconductor layer of a second conductivity type formed on the second semiconductor layer of the first conductivity type; and
at least one diffusion layer of the first conductivity type formed from the surface of the semiconductor layer of the second conductivity type so as to reach the surface of the second semiconductor layer of the first conductivity type, the at least one diffusion layer subdividing the semiconductor layer of the second conductivity type into a plurality of semiconductor regions of the second conductivity type,
wherein at least one photodiode portion for converting signal light into an electrical signal is formed at a junction between at least one of the plurality of semiconductor regions of the second conductivity type and the second semiconductor layer of the first conductivity type, and
wherein a depletion layer which is formed in the second semiconductor layer of the first conductivity type when a reverse bias voltage is applied to the at least one photodiode portion has a field intensity of about 0.3 V/$\mu$m or more.

* * * * *